US012642135B2

(12) United States Patent
Hu et al.

(10) Patent No.: US 12,642,135 B2
(45) Date of Patent: May 26, 2026

(54) ELECTRONIC DEVICE

(71) Applicant: Innolux Corporation, Miao-Li County (TW)

(72) Inventors: Shun-Yuan Hu, Miao-Li County (TW); Li-Wei Mao, Miao-Li County (TW); Ker-Yih Kao, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 782 days.

(21) Appl. No.: 17/947,178

(22) Filed: Sep. 19, 2022

(65) Prior Publication Data

US 2023/0128693 A1 Apr. 27, 2023

Related U.S. Application Data

(60) Provisional application No. 63/271,230, filed on Oct. 25, 2021.

(30) Foreign Application Priority Data

Jul. 8, 2022 (CN) ......................... 202210799125.X

(51) Int. Cl.
$\begin{array}{ll} H01L\ 25/075 & (2006.01) \\ H10H\ 20/819 & (2025.01) \\ H10W\ 90/00 & (2026.01) \end{array}$

(52) U.S. Cl.
CPC .......... *H10W 90/00* (2026.01); *H10H 20/819* (2025.01)

(58) Field of Classification Search
CPC . H01L 25/0753; H10H 20/817; H10H 20/819
See application file for complete search history.

(56) References Cited

U.S. PATENT DOCUMENTS

2015/0091787 A1* 4/2015 Ohmae ..................... F21K 9/00
345/83

FOREIGN PATENT DOCUMENTS

| | | |
|---|---|---|
| CN | 104517946 | 4/2015 |
| CN | 107221302 | 1/2020 |
| CN | 114823789 | 7/2022 |

OTHER PUBLICATIONS

"Office Action of Taiwan Counterpart Application", issued on Oct. 6, 2023, p. 1-p. 6.
"Office Action of China Counterpart Application", issued on Dec. 17, 2025, p. 1-p. 6.

* cited by examiner

*Primary Examiner* — Matthew C Landau
*Assistant Examiner* — Dmitriy Yemelyanov
(74) *Attorney, Agent, or Firm* — JCIPRNET

(57) ABSTRACT

An electronic device is provided. The electronic device includes a substrate, a first semiconductor element, and a second semiconductor element. The first semiconductor element is disposed on the substrate. The first semiconductor element includes a first polarity direction. The second semiconductor element is disposed on the substrate and is adjacent to the first semiconductor element. The second semiconductor element includes a second polarity direction. The first polarity direction and the second polarity direction are different. In the disclosure, the problem of chromatic aberration of the electronic device at different viewing angles is improved.

5 Claims, 17 Drawing Sheets

ELECTRONIC DEVICE

CROSS-REFERENCE TO RELATED APPLICATION

This application claims the priority benefits of U.S. provisional application Ser. No. 63/271,230, filed on Oct. 25, 2021, and China application serial no. 202210799125.X, filed on Jul. 8, 2022. The entirety of each of the above-mentioned patent applications is hereby incorporated by reference herein and made a part of this specification.

BACKGROUND

Technical Field

The disclosure discloses an electronic device, and in particular, relates to an electronic device that can improve the problem of chromatic aberration at different viewing angles.

Description of Related Art

Electronic devices or splicing electronic devices have been widely applied in different fields such as communication, display, vehicle, or aviation. With the vigorous advancement of electronic devices, the development of the electronic devices moves towards thinness and lightness. Therefore, the requirements for reliability and quality of the electronic devices continue to grow.

SUMMARY

The disclosure provides an electronic device in which the problem of chromatic aberration of the electronic device at different viewing angles is improved.

According to an embodiment of the disclosure, an electronic device includes a substrate, a first semiconductor element, and a second semiconductor element. The first semiconductor element is disposed on the substrate. The first semiconductor element includes a first polarity direction. The second semiconductor element is disposed on the substrate and is adjacent to the first semiconductor element. The second semiconductor element includes a second polarity direction. The first polarity direction and the second polarity direction are different.

BRIEF DESCRIPTION OF THE DRAWINGS

The accompanying drawings are included to provide a further understanding of the disclosure, and the accompanying drawings are incorporated in and constitute a part of this specification. The drawings illustrate the embodiments of the disclosure, and together with the description, serve to explain the principle of the disclosure.

FIG. 6 is a schematic top view of an electronic device according to another embodiment of the disclosure.

FIG. 7 is a schematic top view of an electronic device according to another embodiment of the disclosure.

DESCRIPTION OF THE EMBODIMENTS

Figure 1A:
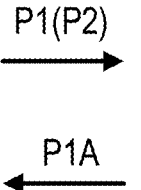
FIG. 1A is a schematic top view of an electronic device according to an embodiment of the disclosure.

The accompanying drawings are included together with the detailed description provided below to provide a further understanding of the disclosure. Note that in order to make the accompanying drawings to be more comprehensible to readers and for the sake of clarity of the accompanying drawings, only part of the electronic device is depicted in the accompanying drawings of the disclosure, and specific elements in the drawings are not depicted according to actual scales. In addition, the numbers and sizes of the elements in each drawing are provided for illustration only and are not used to limit the scope of the disclosure.

In the following specification and claims, the words "containing" and "including" are open-ended words and therefore should be interpreted as "containing but not limited to . . . ".

It should be understood that when an element or a film layer is referred to as being "on" or "connected to" another element or film layer, it can be directly on the another element or film layer or be directly connected to the another element or film layer, or an inserted element or film layer may be provided therebetween (not a direct connection). In contrast, when the element is referred to as being "directly on" another element or film layer or "directly connected to" another element or film layer, an inserted element or film layer is not provided therebetween.

Although the terms "first", "second", "third" . . . may be used to describe various constituent elements, the constituent elements are not limited to these terms. These terms are only used to distinguish a single constituent element from other constituent elements in the specification. The same terms may not be used in the claims, and the elements in the claims may be replaced with first, second, third . . . according to the order declared by the elements in the claims. Therefore, in the following description, the first constituent element may be the second constituent element in the claims.

In the text, the terms "about", "approximately", "substantially", and "roughly" usually mean within 10%, 5%, 3%, 2%, 1%, or 0.5% of a given value or range. The number given here is an approximate number, that is, the meanings of "about", "approximately", "substantially", and "roughly" may still be implied without specifying "about", "approximately", "substantially", and "roughly".

In some embodiments of the disclosure, regarding the words such as "connected", "interconnected", etc. referring to bonding and connection, unless specifically defined, these words mean that two structures are in direct contact or two structures are not in direct contact, and other structures are provided to be disposed between the two structures. The word for joining and connecting may also include the case where both structures are movable or both structures are fixed. In addition, the word "coupled" may include any direct or indirect electrical connection means.

In the disclosure, the thickness, length, width, and area may be measured by an optical microscope, and the thickness may be measured from a cross-sectional image in an electron microscope, but it is not limited thereto. In addition, a certain error may be provided between any two values or directions used for comparison. If the first value is equal to the second value, it implies that an error of approximately 10% is provided between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

The electronic device of the disclosure may include but not limited to a display device, an antenna device, a light emitting device, a touch-control device, a sensing device, or a splicing device. The electronic device may be a bendable or flexible electronic device, but it is not limited thereto. The electronic device may include, for example, liquid crystal, a diode, a light emitting diode, a quantum dot (QD), fluorescence, phosphor, other suitable materials, or a combination of the foregoing. The light emitting diode may include but not limited to an organic light emitting diode (OLED), a mini LED, a micro LED, or a QD LED (e.g., QLED and QDLED), fluorescence, phosphor, or other suitable materials, or a combination of the foregoing, for example, and the materials thereof may be arranged and combined arbitrarily. The splicing device may be, for example, a display splicing device or an antenna splicing device, but it is not limited thereto. Note that the electronic device may be any combination of the foregoing, but is not limited thereto. Hereinafter, an electronic device is provided herein to describe the content of the disclosure, but the disclosure is not limited thereto.

It should be understood that in the following embodiments, the features of several different embodiments may be replaced, recombined, and mixed to complete other embodiments without departing from the spirit of the disclosure. As long as the features of the embodiments do not violate or do not conflict with the spirit of the disclosure, they may be mixed and matched arbitrarily.

Descriptions of the disclosure are given with reference to the exemplary embodiments illustrated by the accompanying drawings. Wherever possible, the same reference numbers are used in the drawings and the description to refer to the same or like parts.

Figure 1B:
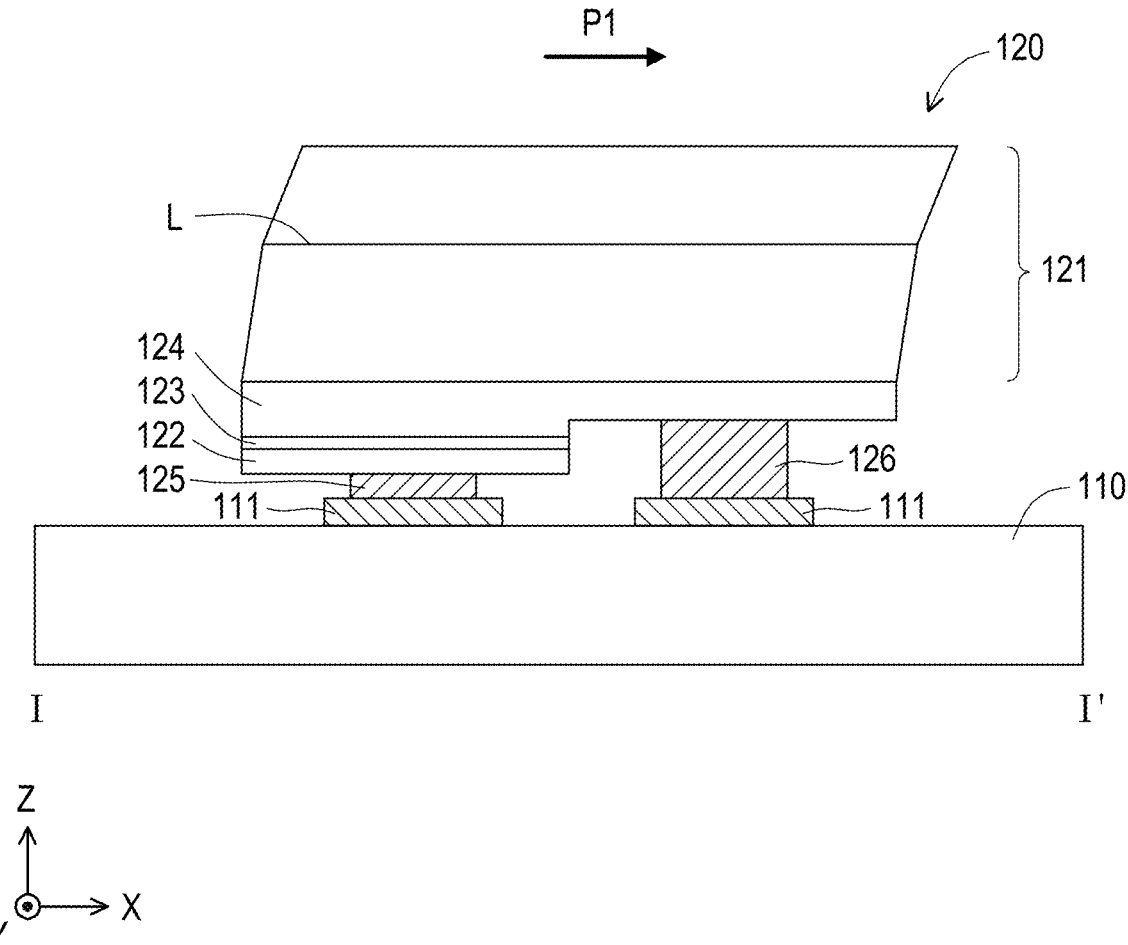
FIG. 1B is a schematic cross-sectional view of the electronic device of FIG. 1A taken along the section line I-I'.
Figure 1C:
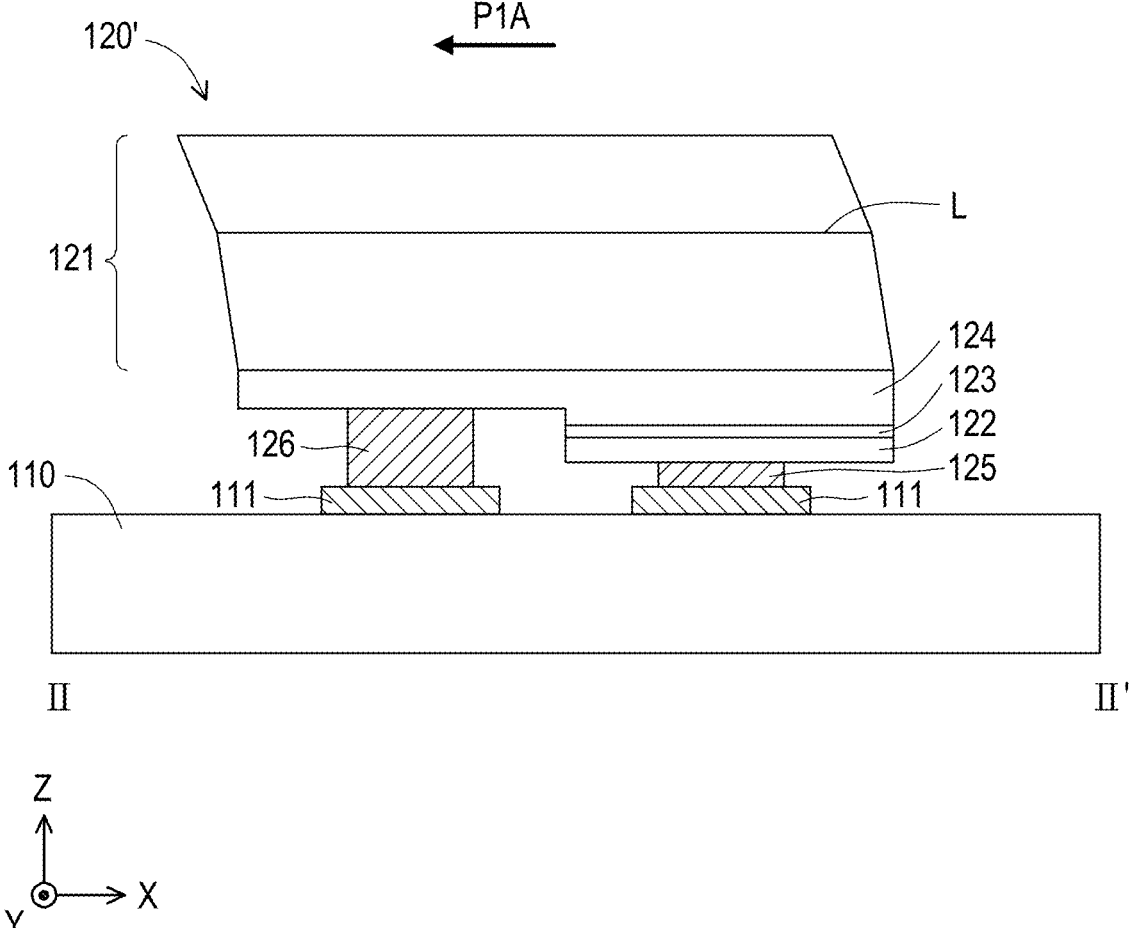
FIG. 1C is a schematic cross-sectional view of the electronic device of FIG. 1A taken along the section line II-II'.
Figure 1D:
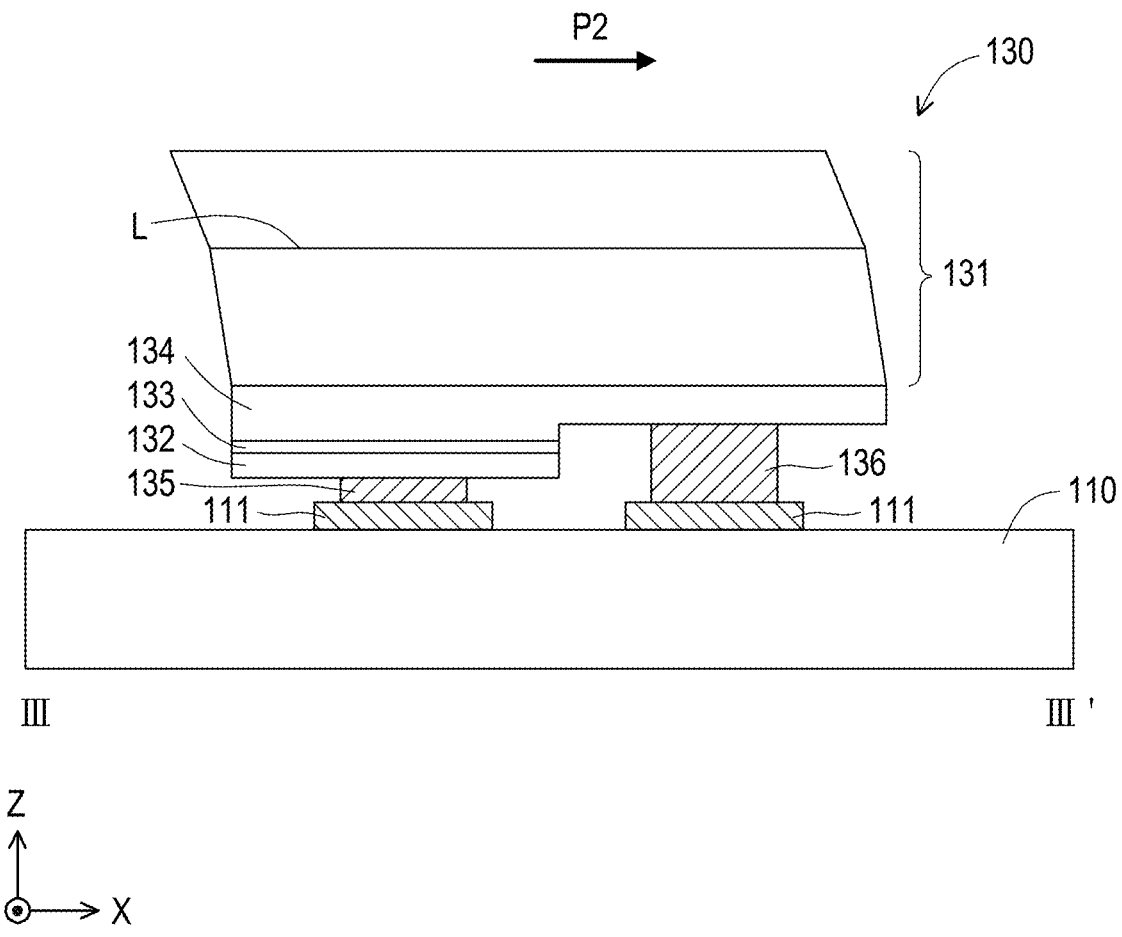
FIG. 1D is a schematic cross-sectional view of the electronic device of FIG. 1A taken along the section line III-III'.

FIG. 1A is a schematic top view of an electronic device according to an embodiment of the disclosure. FIG. 1B is a schematic cross-sectional view of the electronic device of FIG. 1A taken along the section line I-I'. FIG. 1C is a schematic cross-sectional view of the electronic device of FIG. 1A taken along the section line II-II'. FIG. 1D is a schematic cross-sectional view of the electronic device of FIG. 1A taken along the section line III-III'. For clarity of the accompanying drawings and convenience of description, several elements in the electronic device are omitted in FIG. 1A.

With reference to FIG. 1A to FIG. 1D, in this embodiment, an electronic device 100 may include a substrate 110, a semiconductor element 120, a semiconductor element 130, and a semiconductor element 140. Herein, the substrate 110 may be, for example, a rigid substrate, a flexible substrate, or a combination of the foregoing. For instance, the material of the substrate 110 may include but not limited to glass, quartz, sapphire, ceramics, polycarbonate (PC), polyimide (PI), polyethylene terephthalate (PET), other suitable substrate materials, or a combination of the foregoing materials.

To be specific, the electronic device 100 also includes pixel units 101, 102, 103, 104, 105, and 106. Herein, the pixel unit 101, the pixel unit 102, and the pixel unit 103 are sequentially arranged in a direction X in a first column R1 of a matrix, and the pixel unit 104, the pixel unit 105, and the pixel unit 106 are sequentially arranged in the direction X in a second column R2 of the matrix. The pixel unit 104 and the pixel unit 101 are sequentially arranged in a direction Y in a first row C1 of the matrix, the pixel unit 105 and the pixel unit 102 are sequentially arranged in the direction Y in a second row C2 of the matrix, and the pixel unit 106 and the pixel unit 103 are sequentially arranged in the direction Y in a third row C3 of the matrix. As shown in FIG. 1A, there may be, for example, 6 pixel units arranged on the substrate 110 in a 2×3 matrix (i.e., 2 columns and 3 rows), but the number of pixel units is not particularly limited in the disclosure. In other words, the pixel unit 101 may be adjacent to the pixel unit 102 in the direction X, and the pixel unit 101 may be adjacent to the pixel unit 104 in the direction Y. In addition, in this embodiment, the direction X, a direction −X, the direction Y, a direction −Y, and a direction Z are different directions. For instance, the direction X is, for example, an arrangement direction in which the pixel unit 101, the pixel unit 102, and the pixel unit 103 are arranged in order, the direction Y is, for example, an arrangement direction in which the pixel unit 104 and the pixel unit 101 are arranged in order, and the direction Z is, for example, a normal direction of the substrate 110. The direction X is substantially perpendicular to the direction Y, the direction X and the direction Y are substantially perpendicular to the direction Z, the direction X and the direction −X are opposite to each other, and the direction Y and the direction −Y are opposite to each other, but the disclosure is not limited thereto.

In this embodiment, each of the pixel unit 101, the pixel unit 103, the pixel unit 104, the pixel unit 105, and the pixel unit 106 may include the semiconductor element 120, the semiconductor element 130, and the semiconductor element 140, and the pixel unit 102 may include a semiconductor element 120', the semiconductor element 130, and the semiconductor element 140, but the disclosure is not limited thereto. The semiconductor element 120 (or semiconductor element 120), the semiconductor element 130, and the semiconductor element 140 may be, for example, flip chip light emitting diodes or other suitable diodes emitting different colors. For example, the semiconductor element 120 (or the semiconductor element 120') may be, for example, a red light emitting diode, the semiconductor element 130 may be, for example, a green light emitting diode, and semiconductor element 140 may be, for example, a blue light emitting diode, but the disclosure is not limited thereto. That is, the semiconductor element 120 and the semiconductor element 120' are disposed in different pixel units, but the semiconductor element 120 and the semiconductor element 120' may be light emitting diodes emitting the same color.

With reference to FIG. 1A, FIG. 1B, and FIG. 1C again, the semiconductor element 120 (or semiconductor element 120') is disposed on the substrate 110. The semiconductor element 120 (or semiconductor element 120') includes a sapphire material 121, a first-type semiconductor layer 122, a light emitting layer 123, a second-type semiconductor layer 124, a first-type electrode 125, and a second-type electrode 126. The sapphire material 121 is disposed on the surface of the second-type semiconductor layer 124 (i.e., the surface of the second-type semiconductor layer 124 away from the light emitting layer 123) and has a laser cutting mark L extending in the long axis direction (e.g., direction X). The light emitting layer 123 is disposed on the other surface of the second-type semiconductor layer 124, so that the light emitting layer 123 is located between the first-type semiconductor layer 122 and the second-type semiconductor layer 124. The first-type electrode 125 is disposed on the first-type semiconductor layer 122, and the second-type electrode 126 is disposed on the second-type semiconductor layer 124. The semiconductor element 120 (or semiconductor element 120') may be bonded to the substrate 110 through pads 111 disposed on the substrate 110, and the light emitting layer 123 may emit light towards the direction of the sapphire material 121. In this embodiment, the first-type semiconductor layer 122 is, for example, a P-type doped P-type semiconductor, the second-type semiconductor layer 124 is, for example, an N-type doped N-type semiconductor material, the first-type electrode 125 is, for example, a P-type electrode, and the second-type electrode 126 is, for example, an N-type electrode, but the disclosure is not limited thereto. In this embodiment, each of the first-type electrode 125 and the second-type electrode 126 may be a multi-layer electrode, such as a metal electrode, a non-metal electrode, and a metal-non-metal composite layer electrode, but the disclosure is not limited thereto.

With reference to FIG. 1A and FIG. 1D again, the semiconductor element 130 is disposed on the substrate 110 and is adjacent to the semiconductor element 120 (or the semiconductor element 120'). The semiconductor element 140 is disposed on the substrate 110 and is adjacent to the semiconductor element 130. The semiconductor element 130 (or the semiconductor element 140) includes a sapphire material 131, a first-type semiconductor layer 132, a light emitting layer 133, a second-type semiconductor layer 134, a first-type electrode 135, and a second-type electrode 136. The sapphire material 131 is disposed on the surface of the second-type semiconductor layer 134 (e.g., the surface of the second-type semiconductor layer 134 away from the light emitting layer 133) and has a laser cutting mark L extending in the long axis direction (e.g., direction X). The light emitting layer 133 is disposed on the other surface of the second-type semiconductor layer 134, so that the light emitting layer 133 is located between the first-type semiconductor layer 132 and the second-type semiconductor layer 134. The first-type electrode 135 is disposed on the first-type semiconductor layer 132, and the second-type electrode 136 is disposed on the second-type semiconductor layer 134. The semiconductor element 130 (or semiconductor element 140) may be bonded to the substrate 110 through the pads 111 disposed on the substrate 110, and the light emitting layer 133 may emit light towards the direction of the sapphire material 131. In this embodiment, the first-type semiconductor layer 132 is, for example, a P-type doped P-type semiconductor, the second-type semiconductor layer

134 is, for example, an N-type doped N-type semiconductor material, the first-type electrode 135 is, for example, a P-type electrode, and the second-type electrode 136 is, for example, an N-type electrode, but the disclosure is not limited thereto.

With reference to FIG. 1B and FIG. 1D, in this embodiment, the lattice direction (or cleaving direction) of the sapphire material 121 of the semiconductor element 120 is different from the lattice direction (or cleaving direction) of the sapphire material 131 of the semiconductor element 130 (or the semiconductor element 140). Further, the laser-cut and cleaved sapphire material 121 may be inclined to the right (or to one side of the second-type electrode 126), and the laser-cut and cleaved sapphire material 131 may be inclined to the left (or to one side of the first-type electrode 135). Therefore, the sapphire material 121 and the sapphire material 131 have asymmetric shapes, so that the light shape of the semiconductor element 120 in the long axis direction (e.g., direction X) of the sapphire material 121 is asymmetric, and the light shape of the semiconductor element 130 (or semiconductor element 140) in the long axis direction (e.g., direction X) of the sapphire material 131 is asymmetric as well. Next, since the inclination direction of the sapphire material 121 is different from that of the sapphire material 131, the light shape of the semiconductor element 120 is different from that of the semiconductor element 130 (or semiconductor element 140) in the long axis direction (e.g., direction X). As such, the pixel unit 101 (or the pixel unit 103, the pixel unit 104, the pixel unit 105, and the pixel unit 106) including the semiconductor element 120, the semiconductor element 130, and the semiconductor element 140 exhibits chromatic aberration in the color displayed at different viewing angles. Herein, the different viewing angles may include but not limited to, for example, a horizontal viewing angle and a vertical viewing angle, the horizontal viewing angle may include a left viewing angle and a right viewing angle, and the vertical viewing angle may include an upper viewing angle and a lower viewing angle. For instance, when the pixel unit of the electronic device displays a white image, a user can see near-real white from the left viewing angle of the electronic device, but the user can see distorted white from the right viewing angle of the electronic device. As such, a problem of chromatic aberration occurs between the color viewed by the user from the left viewing angle of the electronic device and the color viewed from the right viewing angle.

In this embodiment, the semiconductor element 120 has a polarity direction P1, the semiconductor element 120' has a polarity direction P1A, and the semiconductor element 130 (or semiconductor element 140) has a polarity direction P2. In this embodiment, the polarity direction may be the direction in which the first-type electrode (e.g., the P-type electrode) faces the second-type electrode (e.g., the N-type electrode). Herein, the polarity direction P1 may be, for example, the direction in which the first-type electrode 125 in the semiconductor element 120 faces the second-type electrode 126, the polarity direction P1A may be, for example, the direction in which the first-type electrode 125 faces the second-type electrode 126 in the semiconductor element 120', and the polarity direction P2 may be, for example, the direction in which the first-type electrode 135 in the semiconductor element 130 (or semiconductor element 140) faces the second-type electrode 136, but the disclosure is not limited thereto. In this embodiment, the polarity direction P1 and the polarity direction P2 are substantially the same as the direction X, and the polarity direction P1A is substantially the same as the direction –X.

Figure 11:
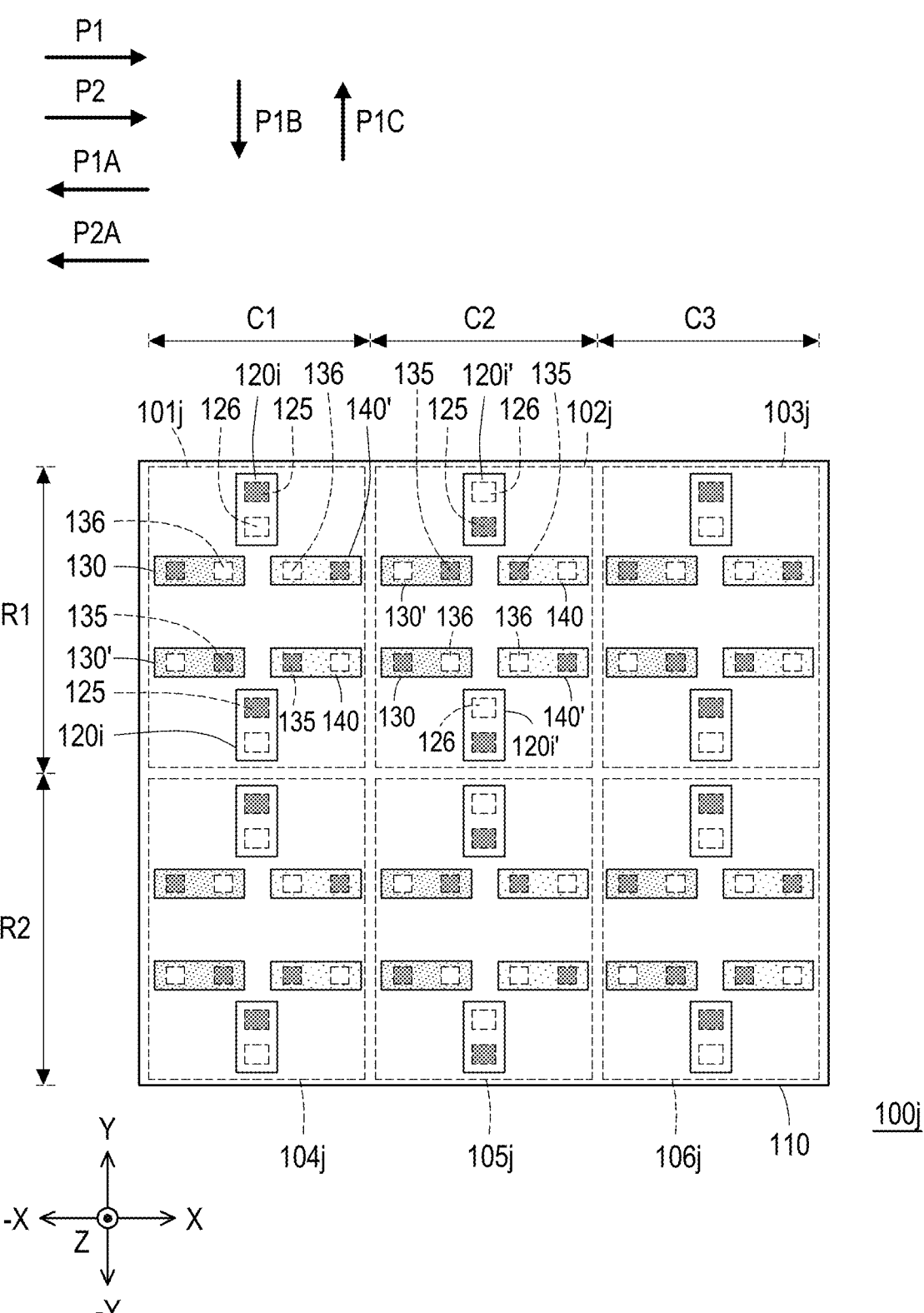
FIG. 11 is a schematic top view of an electronic device according to another embodiment of the disclosure.

That is, the polarity direction P1 and the polarity direction P2 are substantially the same, and the polarity direction P1 (or polarity direction P2) and the polarity direction P1A are different from each other. In some embodiments, as shown in FIG. 11B, the polarity direction may also be, for example, the inclination direction of the sapphire material 121 (e.g., inclined to the right). The inclination direction of the sapphire material 121 (e.g., inclined to the left) in FIG. 1C is different from that in FIG. 1B, so the polarity direction in FIG. 1C is different from that in FIG. 11.

In this embodiment, in each of the pixel unit 101, the pixel unit 103, the pixel unit 104, the pixel unit 105, and the pixel unit 106, the polarity direction P1 of the semiconductor element 120 may be the same as the polarity direction P2 of the semiconductor element 130 (or the semiconductor element 140). However, the polarity direction P1A of the semiconductor element 120' is different from the polarity direction P2 of the semiconductor element 130 (or the semiconductor element 140 in the pixel unit 102), and the polarity direction P1A of the semiconductor element 120' in the pixel unit 102 is also different from the polarity direction P1 of the semiconductor element 120 in the pixel unit 101 (or the pixel unit 103, the pixel unit 104, the pixel unit 105, and the pixel unit 106). In some embodiments, the inclination direction of the sapphire material 121 in the semiconductor element 120' is different from the inclination direction of the sapphire material 121 in the semiconductor element 120, but may be substantially the same as the inclination direction of the sapphire material 131 in the semiconductor element 130 (or semiconductor element 140).

In this embodiment, in the pixel unit 102, the polarity direction P1A of the semiconductor element 120' is different from the polarity direction P2 of the semiconductor element 130 (or the semiconductor element 140). As such, the color displayed by the pixel unit 102 at different viewing angles may be different (for example, distorted white is displayed at the left viewing angle but true white is displayed at the right viewing angle) from the color displayed by the adjacent pixel unit 101 (or the pixel unit 103 and the pixel unit 105) at different viewing angles (for example, true white is displayed at the left viewing angle but distorted white is displayed at the right viewing angle). Further, the color displayed by the adjacent pixel unit 101 (or the pixel unit 103 and the pixel unit 105) at different viewing angles may be balanced through the arrangement of the pixel unit 102, so that the chromatic aberration of the pixel unit 101 (or the pixel unit 103 and the pixel unit 105) at different viewing angles is reduced. Therefore, the chromatic aberration problem of the electronic device 100 at different viewing angles is improved.

For instance, when the electronic device displays a white image, the pixel unit 101 can display true white at the left viewing angle and can display distorted white at the right viewing angle. However, since the pixel unit 102 can display distorted white at the left viewing angle and true white at the right viewing angle, the pixel unit 102 may be used to balance the colors displayed by the pixel unit 101 at the left viewing angle and at the right viewing angle. In this way, the chromatic aberration problem of the pixel unit 101 or the electronic device 100 at the left viewing angle and at the right viewing angle may be improved, and the colors displayed by the electronic device 100 at the left viewing angle and at the right viewing angle may be substantially similar.

In the electronic device 100 of this embodiment, although the chromatic aberration problem of electronic device at different viewing angles is improved by changing the polarity direction of one semiconductor element (i.e., the semiconductor element 120') in one pixel unit (i.e., the pixel unit 102), the number of pixel units or the number of semiconductor elements in which the polarity directions may be changed are not particularly limited. That is, in some embodiments, the chromatic aberration problem of electronic device at different viewing angles may also be improved by changing the polarity direction of one or more semiconductor elements (including the semiconductor element and the semiconductor elements) in one or more pixel units.

In the electronic device 100 provided by this embodiment, although each pixel unit may include 3 semiconductor elements and the 3 semiconductor elements are arranged in a straight line according to the order of the red light emitting diode, the green light emitting diode, and the blue light emitting diode (i.e., the order of red-green-blue), the number, arrangement order, and arrangement manner of the semiconductor elements in each pixel unit are not particularly limited in the disclosure. That is, in some embodiments, each pixel unit may also include more than three semiconductor elements. In some embodiments, the semiconductor elements in each pixel unit may also be arranged in the following order: red-blue-green, green-blue-red, green-red-blue, blue-green-red, and blue-red-green, but not limited thereto. In some embodiments, the semiconductor elements in each pixel unit may also be arranged in a delta manner, a radial manner, a T-shape manner, or a rectangular manner, but not limited thereto.

In the electronic device 100 provided by this embodiment, although 6 pixel units are schematically shown and arranged in a 2×3 matrix, the number and arrangement manner of the pixel units in the electronic device are not particularly limited in the disclosure. That is, in some embodiments, the number of pixel units may also be less than 6 or greater than 6. In some embodiments, in the electronic device, different matrix methods may also be used for arrangement according to needs and the number of pixel units, for example, a matrix of 1×6, 3×4, or 9×16, but not limited thereto.

In the electronic device 100 of this embodiment, although the chromatic aberration problem of electronic device at different viewing angles is improved by changing the polarity direction of any semiconductor element (i.e., the semiconductor element 120') in any pixel unit (i.e., the pixel unit 102), it is not limited in the disclosure to only change the polarity directions of the semiconductor elements to improve the chromatic aberration problem of the electronic device at different viewing angles. In some embodiments, the chromatic aberration problem of the electronic device at different viewing angles may also be improved by changing the inclination directions of the sapphire materials of some semiconductor elements in the electronic device or by changing the number of laser cutting marks L.

For instance, the sapphire material of the semiconductor element (or the semiconductor element) in at least one pixel unit in the electronic device is rotated, so that the sapphire material may be inclined to the left or to the side of the first-type electrode (or may be inclined to the right or to the side of the second-type electrode) and the inclination direction of the sapphire material of the semiconductor element (or the semiconductor element) may be similar to the inclination direction of the sapphire material of the semiconductor element (or the semiconductor element). In this way, the arrangement of the at least one pixel unit may be used to balance the colors displayed by other pixel units at different viewing angles, and the chromatic aberration problem of the electronic device at different viewing angles may thereby be improved.

For instance, by increasing the number of laser cutting marks L of the sapphire material of the semiconductor element (or the semiconductor element) in at least one pixel unit in the electronic device to one or more, cleaving of the sapphire material in the lattice direction may be reduced, and light shape asymmetry may be improved. In this way, the arrangement of the at least one pixel unit may be used to balance the colors displayed by other pixel units at different viewing angles, and the chromatic aberration problem of the electronic device at different viewing angles may thereby be improved.

Other embodiments are described for illustration in the following. It should be noted that the reference numerals and a part of the contents in the previous embodiment are used in the following embodiments, in which identical reference numerals indicate identical or similar components, and repeated description of the same technical contents is omitted. Please refer to the description of the previous embodiments for the omitted content, which will not be repeated hereinafter.

Figure 2:
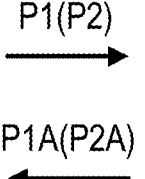
FIG. 2 is a schematic top view of an electronic device according to another embodiment of the disclosure.

FIG. 2 is a schematic top view of an electronic device according to another embodiment of the disclosure. The embodiment shown by FIG. 2 is similar to the embodiment shown by FIG. 1A, and therefore, the same elements are denoted by the same reference numerals and details thereof are not repeated. The difference between the embodiment shown by FIG. 2 and the embodiment shown by FIG. 1A is that: in an electronic device 100a provided by this embodiment, the polarity directions of all the semiconductor elements in the pixel units in the second row C2 (i.e., the pixel unit 102 and the pixel unit 105) are different from the polarity directions of all the semiconductor elements in the pixel units in the first row C1 (i.e., the pixel unit 101 and the pixel unit 104) and the pixel units in the third row C3 (i.e., the pixel unit 103 and the pixel unit 106).

To be specific, with reference to FIG. 2, in the electronic device 100a provided by this embodiment, in each of the pixel unit 101, the pixel unit 103, the pixel unit 104, and the pixel unit 106, the semiconductor element 120 has the polarity direction P1, and the semiconductor element 130 (or the semiconductor element 140) has the polarity direction P2. In each of the pixel unit 102 and the pixel unit 105, the semiconductor element 120' has the polarity direction P1A, and the semiconductor element 130' (or the semiconductor element 140) has a polarity direction P2A. The polarity direction P2A is substantially the same as the direction −X. That is, the semiconductor element 130 and the semiconductor element 130' are disposed in different pixel units, and the semiconductor element 130 and the semiconductor element 130' may be light emitting diodes emitting the same color.

Herein, the polarity direction P1A is different from the polarity direction P1, and the polarity direction P2A is different from the polarity direction P2. Therefore, the colors displayed by the pixel units in the second row C2 (e.g., the pixel unit 102 and the pixel unit 105) at different viewing angles (for example, distorted white is displayed at the left viewing angle but true white is displayed at the right viewing angle) can be different from the colors displayed by the adjacent pixel units in the first row C1 (e.g., the pixel unit 101 and the pixel unit 104) and the pixel units in the third row C3 (e.g., the pixel unit 103 and the pixel unit 106) at different viewing angles (for example, true white is displayed at the left viewing angle but distorted white is displayed at the right viewing angle). Further, the colors displayed by the pixel units in the first row C1 (e.g., the pixel unit 101 and the pixel unit 104) and the pixel units in the third row C3 (e.g., the pixel unit 103 and the pixel unit 106) at different viewing angles may be balanced through the arrangement of the pixel units in the second row C2 (e.g., the pixel unit 102 and the pixel unit 105). In this way, chromatic aberration between the pixel units in the first row C1 (e.g., the pixel unit 101 and the pixel unit 104) and the pixel units in the third row C3 (e.g., pixel unit 103 and pixel unit 106) at different viewing angles is reduced, and that the chromatic aberration problem of the electronic device 100a at different viewing angles is improved.

Therefore, in the electronic device 100a provided by this embodiment, the problem of chromatic aberration of the electronic device 100a at different viewing angles may be improved by arranging semiconductor elements with different polarity directions in pixel units of two adjacent rows (for example, the semiconductor elements of the same polarity direction are arranged in pixel units of one row, and the semiconductor elements of another polarity direction are arranged in pixel units of another row).

Figure 3:
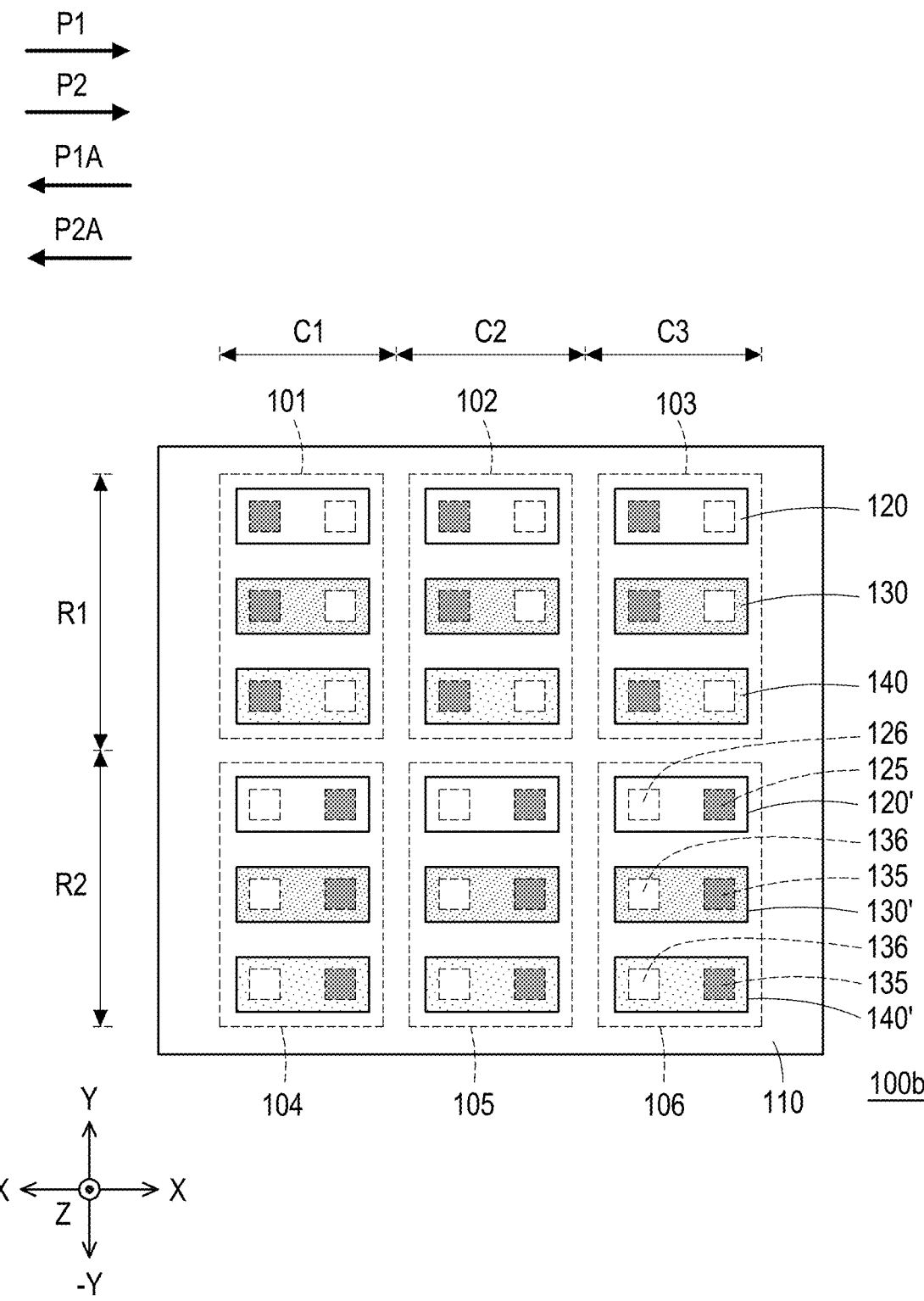
FIG. 3 is a schematic top view of an electronic device according to another embodiment of the disclosure.

FIG. 3 is a schematic top view of an electronic device according to another embodiment of the disclosure. The embodiment shown in FIG. 3 is similar to the embodiment shown in FIG. 1A, and therefore, the same elements are denoted by the same reference numerals and details thereof are not repeated. The difference between the embodiment shown by FIG. 3 and the embodiment shown by FIG. 1A is that: in an electronic device 100b provided by this embodiment, the polarity directions of all the semiconductor elements in the pixel units in the second column R2 (i.e., the pixel unit 104, the pixel unit 105, and the pixel unit 106) are different from the polarity directions of all the semiconductor elements in the pixel units in the first column R1 (i.e., the pixel unit 101, the pixel unit 102, and the pixel unit 103).

To be specific, with reference to FIG. 3, in the electronic device 100b provided by this embodiment, in each of the pixel unit 101, the pixel unit 102, and the pixel unit 103, the semiconductor element 120 has the polarity direction Pt, and the semiconductor element 130 (or the semiconductor element 140) has the polarity direction P2. In each of the pixel unit 104, the pixel unit 105, and the pixel unit 106, the semiconductor element 120' has the polarity direction P1A, and the semiconductor element 130' (or the semiconductor element 140') has the polarity direction P2A. That is, the semiconductor element 140 and the semiconductor element 120' are disposed in different pixel units, and the semiconductor element 140 and the semiconductor element 120' may be light emitting diodes emitting different colors.

Herein, the polarity direction P1A is different from the polarity direction Pt, and the polarity direction P2A is different from the polarity direction P2. Therefore, the colors displayed by the pixel units in the second column R2 (i.e., the pixel unit 104, the pixel unit 105, and the pixel unit 106) at different viewing angles (for example, distorted white is displayed at the left viewing angle but true white is displayed at the tight viewing angle) can be different from the colors displayed by the adjacent pixel units in the first column R1 (i.e., the pixel unit 101, the pixel unit 102, and the pixel unit 103) at different viewing angles (for example, true white is displayed at the left viewing angle but distorted white is displayed at the right viewing angle). Further, the colors displayed by the pixel units in the first column R1 (i.e., the pixel unit 101, the pixel unit 102, and the pixel unit 103) at different viewing angles may be balanced through the arrangement of the pixel units in the second column R2 (i.e., the pixel unit 104, the pixel unit 105, and the pixel unit 106). In this way, the chromatic aberration of the pixel units in the first column R1 (e.g., the pixel unit 101, the pixel unit 102, and the pixel unit 103) at different viewing angles is reduced, and that the chromatic aberration problem of the electronic device 100b at different viewing angles is improved.

Therefore, in the electronic device 100b provided by this embodiment, the problem of chromatic aberration of the electronic device 100b at different viewing angles may be improved by arranging semiconductor elements with different polarity directions in pixel units of two adjacent columns (for example, the semiconductor elements of the same polarity direction are arranged in pixel units of one column, and the semiconductor elements of another polarity direction are arranged in pixel units of another column).

Figure 4:
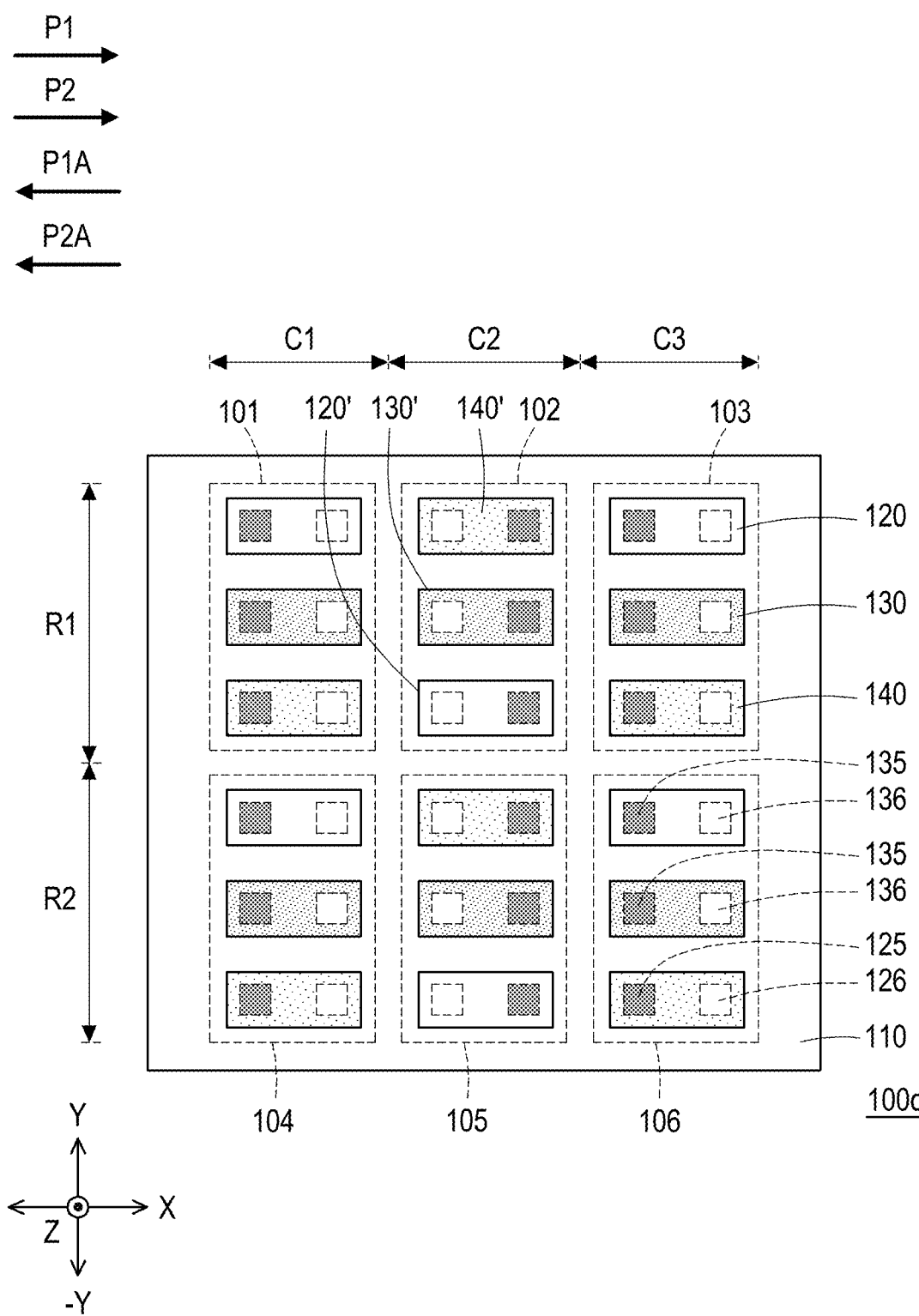
FIG. 4 is a schematic top view of an electronic device according to another embodiment of the disclosure.

FIG. 4 is a schematic top view of an electronic device according to another embodiment of the disclosure. The embodiment shown by FIG. 4 is similar to the embodiment shown by FIG. 2, and therefore, the same elements are denoted by the same reference numerals and details thereof are not repeated. The difference between the embodiment shown by FIG. 4 and the embodiment shown by FIG. 2 is that: in an electronic device 100c provided by this embodiment, the arrangement order of the semiconductor elements in the pixel units in the second row C2 (i.e., the pixel unit 102 and the pixel unit 105) are different from the arrangement orders of the semiconductor elements in the pixel units in the first row C1 (i.e., the pixel unit 101 and the pixel unit 104) and the pixel units in the third row C3 (i.e., the pixel unit 103 and the pixel unit 106). For instance, the arrangement order of the semiconductor elements in the pixel units of the first row C1 and the third row C3 is red-green-blue, and the arrangement order of the semiconductor elements in the pixel units of the second row C2 is blue-green-red, but not limited thereto.

To be specific, with reference to FIG. 4, in the electronic device 100c provided by this embodiment, the semiconductor element 120, the semiconductor element 130, and the semiconductor element 140 in each of the pixel unit 101, the pixel unit 103, the pixel unit 104, and the pixel unit 106 are sequentially arranged in a straight line. In each of the pixel unit 102 and the pixel unit 105, the semiconductor element 140', the semiconductor element 130', and the semiconductor element 120' are sequentially arranged in a straight line. Herein, the semiconductor element 120 (or the semiconductor element 140) in the pixel unit 101, the semiconductor element 120 (or the semiconductor element 140) in the pixel unit 102, and the semiconductor element 120 (or the semiconductor element 140) in the pixel unit 103 may be arranged in an alternating manner in the direction Y.

In this embodiment, the arrangement order of the semiconductor elements in the pixel units in the adjacent first row C1 (i.e., the pixel unit 101 and the pixel unit 104) is different from the arrangement order of the semiconductor elements in the pixel units in the second row C2 (i.e., the pixel unit 102 and the pixel unit 105). As such, the chromatic aberration problem of the electronic device 100c at a vertical viewing angle is improved.

Figure 5:
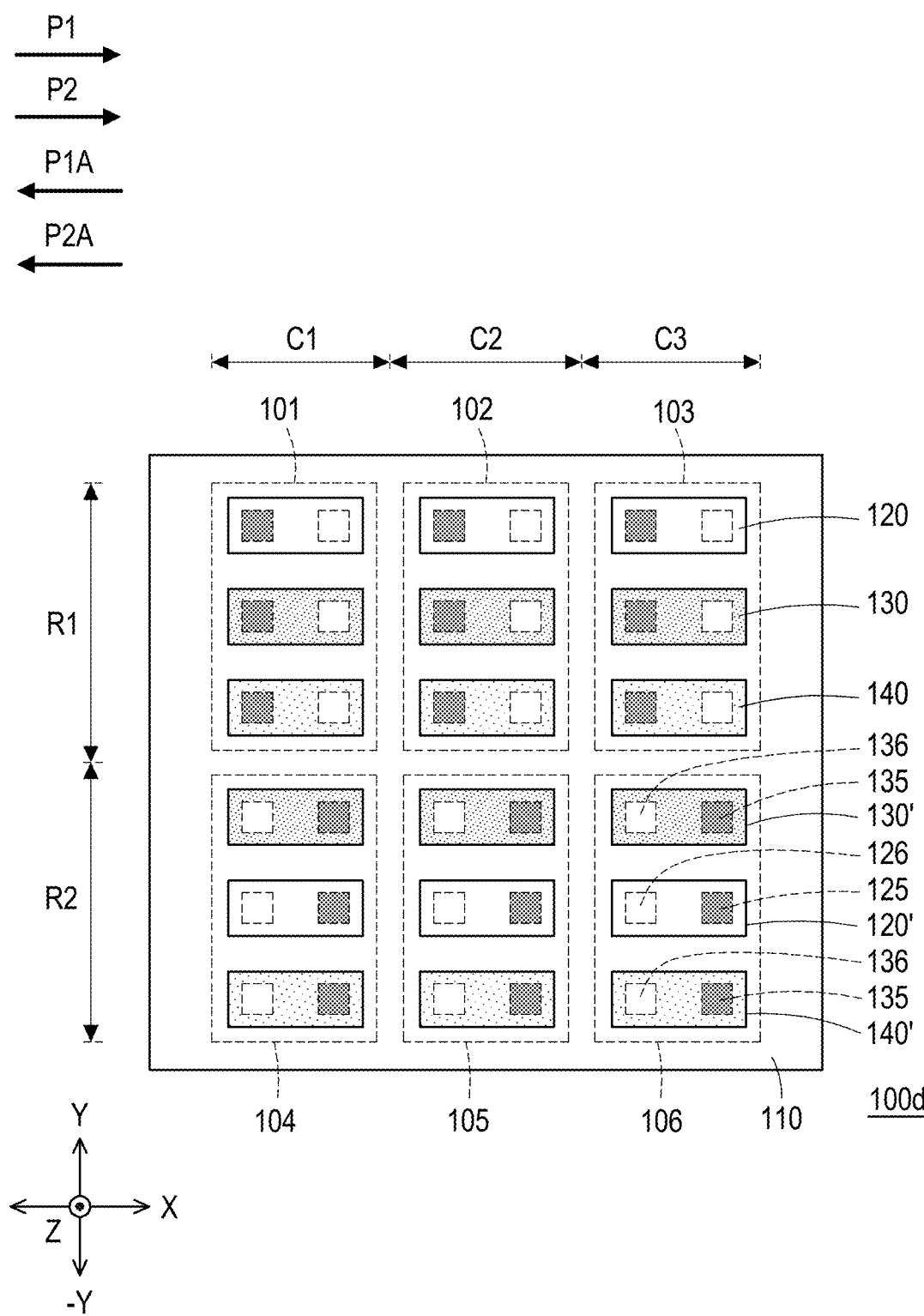
FIG. 5 is a schematic top view of an electronic device according to another embodiment of the disclosure.

FIG. 5 is a schematic top view of an electronic device according to another embodiment of the disclosure. The embodiment shown by FIG. 5 is similar to the embodiment shown by FIG. 3, and therefore, the same elements are denoted by the same reference numerals and details thereof are not repeated. The difference between the embodiment shown by FIG. 5 and the embodiment shown by FIG. 3 is that: in an electronic device 100d provided by this embodiment, the arrangement order of the semiconductor elements in the pixel units in the second column R2 (i.e., the pixel unit 104, the pixel unit 105, and the pixel unit 106) are different from the arrangement direction of the semiconductor elements in the pixel units in the first column R1 (i.e., the pixel unit 101, the pixel unit 102, and the pixel unit 103). For instance, the arrangement order of the semiconductor elements in the pixel units of the first column R1 is red-green-blue, and the arrangement order of the semiconductor elements in the pixel units of the second column R2 is green-red-blue, but not limited thereto.

To be specific, with reference to FIG. 5, in the electronic device 100d provided by this embodiment, the semiconductor element 120, the semiconductor element 130, and the semiconductor element 140 in each of the pixel unit 101, the pixel unit 102, and the pixel unit 103 are sequentially arranged in a straight line. In each of the pixel unit 104, the pixel unit 105, and the pixel unit 106, the semiconductor element 130', the semiconductor element 120', and the semiconductor element 140' are sequentially arranged in a straight line. That is, the semiconductor element 140 and the semiconductor element 130' are disposed in different pixel units, and the semiconductor element 140 and the semiconductor element 130' may be light emitting diodes emitting different colors.

In this embodiment, the arrangement order of the semiconductor elements in the pixel units in the adjacent second column R1 (i.e., the pixel unit 104, the pixel unit 105, and the pixel unit 106) is different from the arrangement order of the semiconductor elements in the pixel units in the first column R1 (i.e., the pixel unit 101, the pixel unit 102, and the pixel unit 103). As such, the chromatic aberration problem of the electronic device 100d at a vertical viewing angle is improved.

Figure 6:
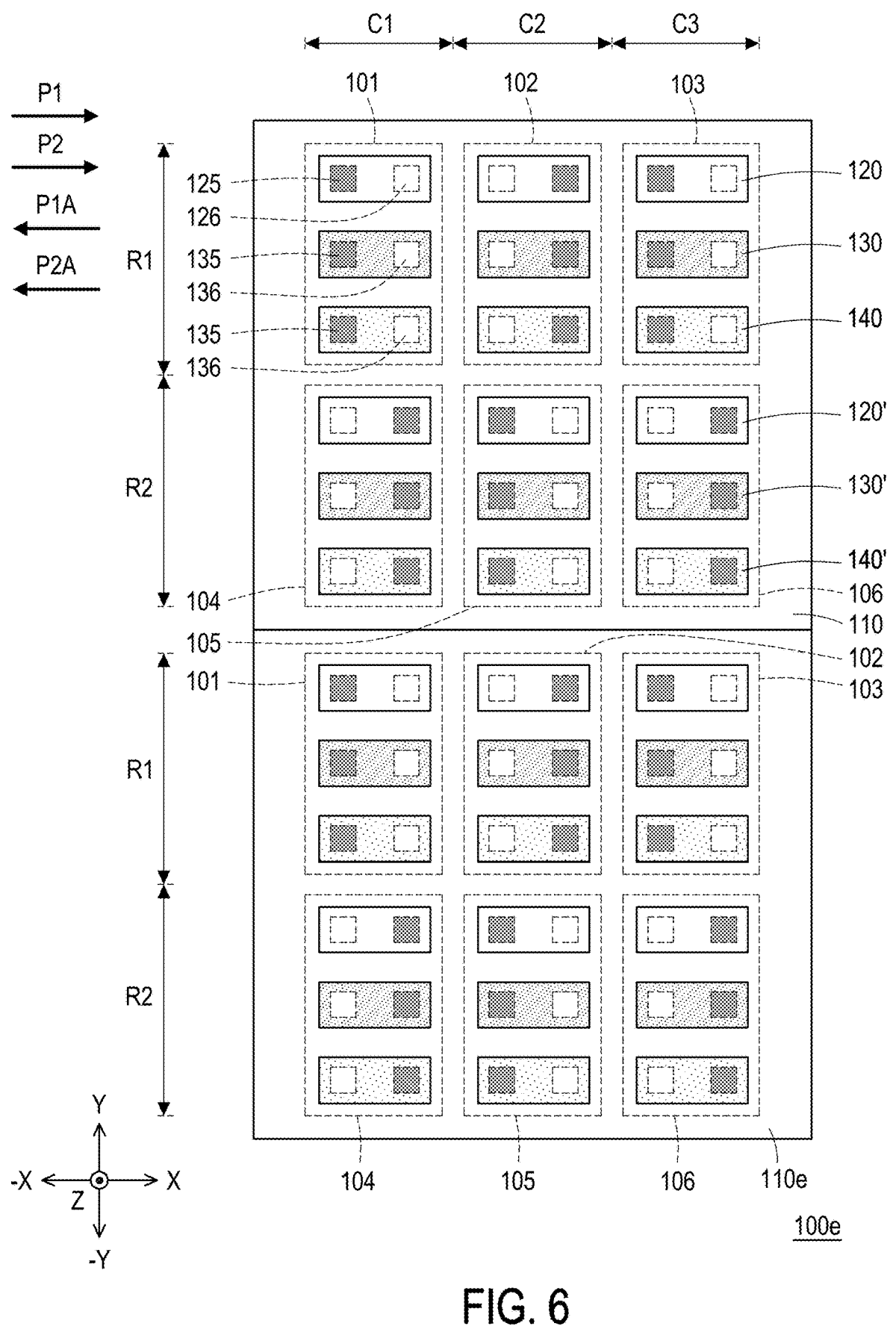

FIG. 6 is a schematic top view of an electronic device according to another embodiment of the disclosure. The embodiment shown by FIG. 6 is similar to the embodiment shown by FIG. 1A, and therefore, the same elements are denoted by the same reference numerals and details thereof are not repeated. The difference between the embodiment shown by FIG. 6 and the embodiment shown by FIG. 1A is that: an electronic device 100e of this embodiment further includes another substrate 110e. The arrangement of the pixel units on the another substrate 110e is the same as the arrangement of the pixel units on the substrate 110, and the another substrate 110e and the substrate 110 may be spliced together in the direction Y. Besides, on the substrate 110 and the another substrate 110e, the polarity directions of all the semiconductor elements in the pixel unit 102, the pixel unit 104, and the pixel unit 106 are different from the polarity directions of all the semiconductor elements in the pixel unit 101, the pixel unit 103, and the pixel unit 105.

To be specific, with reference to FIG. 6, in the electronic device 100e provided by this embodiment, in each of the pixel unit 101, the pixel unit 103, and the pixel unit 105, the semiconductor element 120 has the polarity direction P1, and the semiconductor element 130 (or the semiconductor element 140) has the polarity direction P2. In each of the pixel unit 102, the pixel unit 104, and the pixel unit 106, the semiconductor element 120' has the polarity direction P1A, and the semiconductor element 130' (or the semiconductor element 140') has the polarity direction P2A.

Herein, the polarity direction P1A is different from the polarity direction P1, and the polarity direction P2A is different from the polarity direction P2. Therefore, the colors displayed by the pixel unit 102, the pixel unit 104, and the pixel unit 106 at different viewing angles (for example, distorted white is displayed at the left viewing angle but true white is displayed at the right viewing angle) can be different from the colors displayed by the pixel unit 101, the pixel unit 103, and the pixel unit 105 at different viewing angles (for example, true white is displayed at the left viewing angle but distorted white is displayed at the right viewing angle). The colors displayed by the pixel unit 101, the pixel unit 103, and the pixel unit 105 at different viewing angles may be balanced through the arrangement of the pixel unit 102, the pixel unit 104, and the pixel unit 106, so that the chromatic aberration of the pixel unit 101, the pixel unit 103, and the pixel unit 105 at different viewing angles is reduced, and that the chromatic aberration problem of the electronic device 100e at different viewing angles is improved.

Therefore, in the electronic device 100e provided by this embodiment, the problem of chromatic aberration of the electronic device 100e at different viewing angles may be improved by arranging semiconductor elements with different polarity directions in two adjacent pixel units (for example, the semiconductor elements of one polarity direction are arranged in one pixel unit, and the semiconductor elements of another polarity direction are arranged in the other pixel unit).

In this embodiment, although the electronic device 100e includes the another substrate 110e and the another substrate 110e is spliced with the substrate 110 in the direction Y, the number of the another substrate in the electronic device and the splicing manner of the another substrate and the substrate are not particularly limited in the disclosure. That is, the electronic device may also include one another substrate or more in some embodiments, and the another substrate may also be spliced together with the substrate in the direction X in some embodiments. The electronic device may also include one another substrate or more in some embodiments, and the another substrate or more may also be spliced together with the substrate or another substrate in the direction Y and/or in the direction X in some embodiments.

In addition, in the electronic device 100 provided by this embodiment, although the semiconductor elements in each of the pixel unit 102, the pixel unit 104, and the pixel unit 106 are arranged in a straight line according to the order of the red light emitting diode, the green light emitting diode, and the blue light emitting diode (referred to as red-green-blue for short), the arrangement order and arrangement manner of the semiconductor elements in each of the pixel units are not particularly limited in the disclosure. That is, in some embodiments, the semiconductor elements in each pixel unit may also be arranged in the following order: red-blue-green, green-blue-red, green-red-blue, blue-green-red, and blue-red-green, but not limited thereto. In some embodiments, the semiconductor elements in each pixel unit may also be arranged in a delta manner, a radial manner, a T-shape manner, or a rectangular manner, but not limited thereto.

Figure 7:
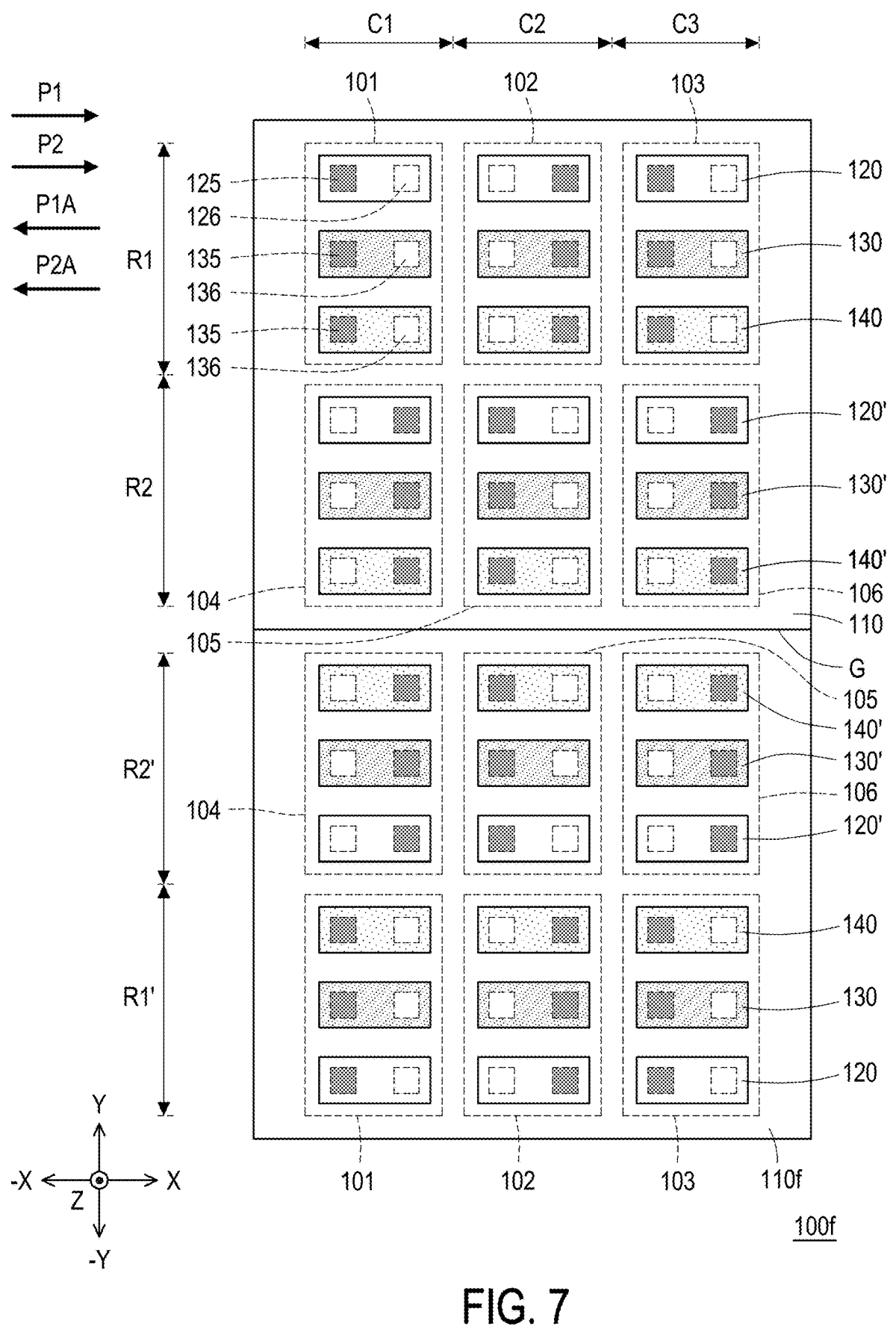

FIG. 7 is a schematic top view of an electronic device according to another embodiment of the disclosure. The embodiment shown by FIG. 7 is similar to the embodiment shown by FIG. 6, and therefore, the same elements are denoted by the same reference numerals and details thereof are not repeated. The difference between the embodiment shown by FIG. 7 and the embodiment shown by FIG. 6 is that: in an electronic device 100f provided by this embodiment, the substrate 110 and another substrate 110f are spliced in a mirror-symmetrical manner.

To be specific, with reference to FIG. 7, in the electronic device 100f provided by this embodiment, the substrate 110 may be spliced together with the another substrate 110f in the direction Y, and a splicing seam G may be provided at the interface between the substrate 110 and the another substrate 110f. Herein, the substrate 110 and the another substrate 110f may be spliced in a mirror-symmetrical manner by taking the splicing seam G as an axis of symmetry. Therefore, the second column R2 on the substrate 110 may be closer to the second column R2' on the another substrate 110f than the first column R1, and the semiconductor element 140' (or the semiconductor element 140) in each pixel unit of the second column R2 on the substrate 110 may be closer to the semiconductor element 140' (or the semiconductor element 140) in each pixel unit of the second column R2' on the another substrate 110f than the semiconductor element 120' (or the semiconductor element 120). In this embodiment, in the electronic device 100f, the substrate 110 and the another substrate 110f are spliced in a mirror-symmetrical manner, so that the light emitting colors and the polarity directions of the semiconductor elements may also be mirror-symmetrical. Taking the mirror symmetry of the polarity directions as an example, on the substrate 110 and the another substrate 110e, the polarity directions of the semiconductor elements in the pixel unit 102, the pixel unit 104, and the pixel unit 106 are different from the polarity directions of the semiconductor elements in the pixel unit 101, the pixel unit 103, and the pixel unit 105. Taking the mirror symmetry of the light emitting colors as an example, if the arrangement order of the light emitting colors of the semiconductor elements in the pixel unit 105 on the substrate 110 is, for example, red-green-blue, the arrangement order of the light emitting colors of the semiconductor elements in the pixel unit 105 on the another substrate 110f may be blue-green-red. The above description only takes the pixel unit 105 as an example, and description of other pixel units may be deduced by analogy. In some embodiments, the substrate is spliced with another substrate, and mirror symmetry may also be performed only on the polarity directions of the semiconductor elements. In some embodiments, the substrate is spliced with another substrate, and mirror symmetry may also be performed only on the light emitting colors of the semiconductor elements.

Figure 8:
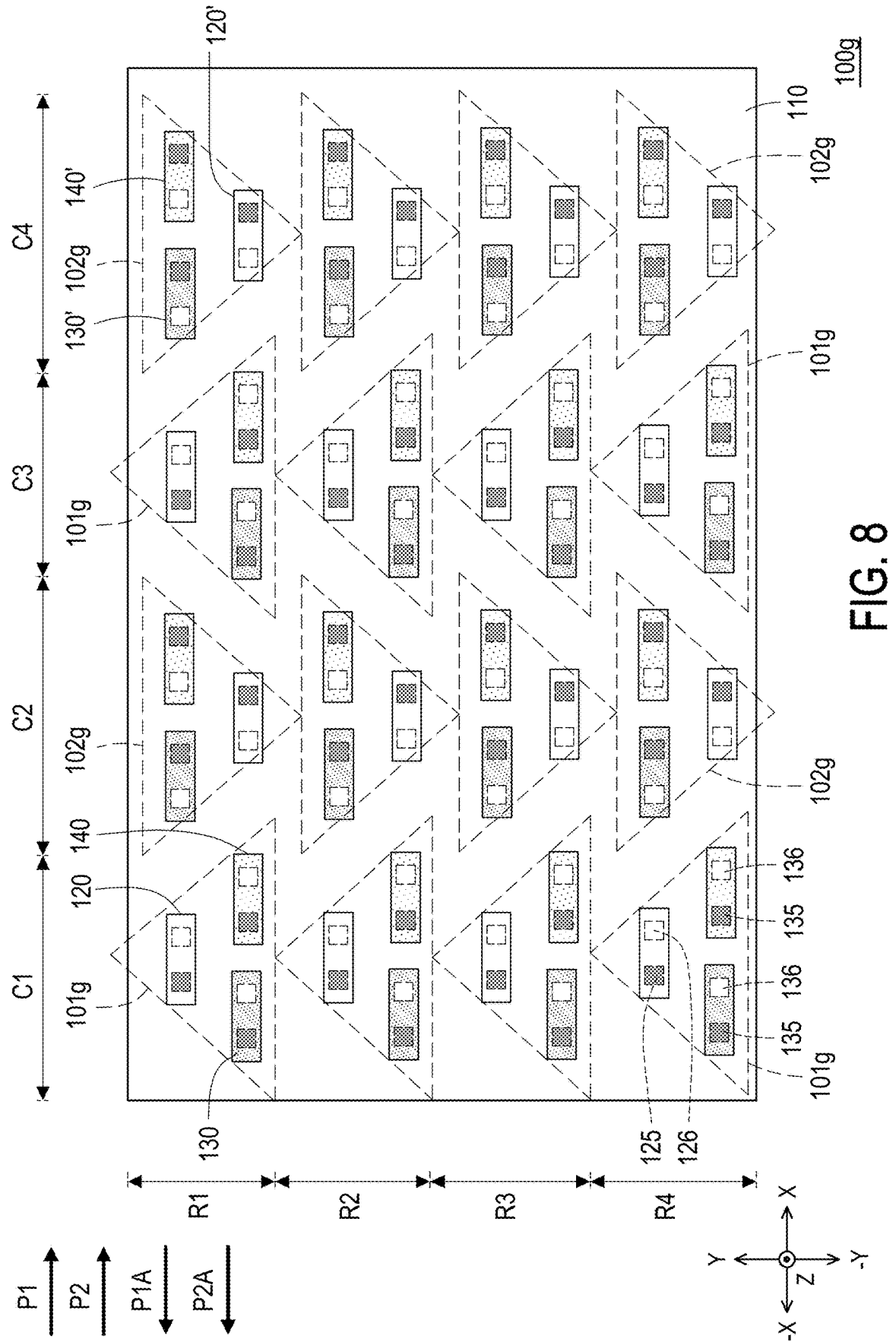
FIG. 8 is a schematic top view of an electronic device according to another embodiment of the disclosure.

FIG. 8 is a schematic top view of an electronic device according to another embodiment of the disclosure. The embodiment shown by FIG. 8 is similar to the embodiment shown by FIG. 1A, and therefore, the same elements are denoted by the same reference numerals and details thereof are not repeated. The difference between the embodiment shown by FIG. 8 and the embodiment shown by FIG. 1A is that: an electronic device 100g provided by this claim includes 16 pixel units (i.e., 8 pixel units 101g and 8 pixel units 102g) arranged in a 4×4 matrix (i.e., 4 columns and 4 rows), and the semiconductor elements in each pixel unit are arranged in a delta manner.

To be specific, with reference to FIG. 8, in the electronic device 100g provided by this embodiment, each of the first row C1 and the third row C3 is provided with four pixel units 101g, and each of the second row C and a fourth row C4 is provided with four pixel units 102g, and the pixel units 101g and the pixel units 102g may be disposed adjacent to each other in the direction X. The semiconductor element 120, the semiconductor element 130, and the semiconductor element 140 in each of the pixel units 101g are sequentially arranged in a delta manner in a counterclockwise direction, and the semiconductor element 120, the semiconductor element 130', and the semiconductor element 130' in each of the pixel units 102g are sequentially arranged in a delta manner in a clockwise direction Therefore, the semiconductor elements of the same color may be prevented from grouping together in the direction X or the direction Y. That is, the semiconductor element 120, the semiconductor element 140, and the semiconductor element 130 are arranged in the same pixel unit 101g, and the semiconductor element 120, the semiconductor element 140, and the semiconductor element 130 are arranged in a delta manner. The semiconductor element 130', the semiconductor element 120', and the semiconductor element 140' are arranged in the same pixel unit 102g, and the semiconductor element 130', the semiconductor element 120', and the semiconductor element 140' are arranged in a delta manner.

In this embodiment, in each of the pixel units 101g, the semiconductor element 120 has the polarity direction P1, and the semiconductor element 130 (or the semiconductor element 140) has the polarity direction P2. In each of the pixel units 102g, the semiconductor element 120' has the polarity direction P1A, and the semiconductor element 130' (or the semiconductor element 140') has the polarity direction P2A. Herein, the polarity direction P1A is different from the polarity direction P1, and the polarity direction P2A is different from the polarity direction P2. Therefore, the color displayed by the pixel units 102g of the second row C2 and the fourth row C4 at different viewing angles (for example, distorted white is displayed at the left viewing angle but true white is displayed at the right viewing angle) can be different from the color displayed by the pixel units 101g of the first row C1 and the third row C3 at different viewing angles (for example, true white is displayed at the left viewing angle but distorted white is displayed at the right viewing angle). As such, the color displayed by the pixel units 1010g of the first row C1 and the third row C3 at different viewing angles may be balanced through the arrangement of the pixel units 102g of the second row C2 and the fourth row C4, so that the chromatic aberration of the pixel units 101g of the first row C1 and the third row C3 at different viewing angles is reduced, and that the chromatic aberration problem of the electronic device 100g at different viewing angles is improved.

Therefore, in the electronic device 100g provided by this embodiment, the problem of chromatic aberration of the electronic device 100g at different viewing angles may be improved by arranging semiconductor elements with different polarity directions in pixel units of two adjacent rows (that is, the semiconductor elements of the same polarity direction are arranged in pixel units of one row, and the semiconductor elements of another polarity direction are arranged in pixel units of another row).

Figure 9:
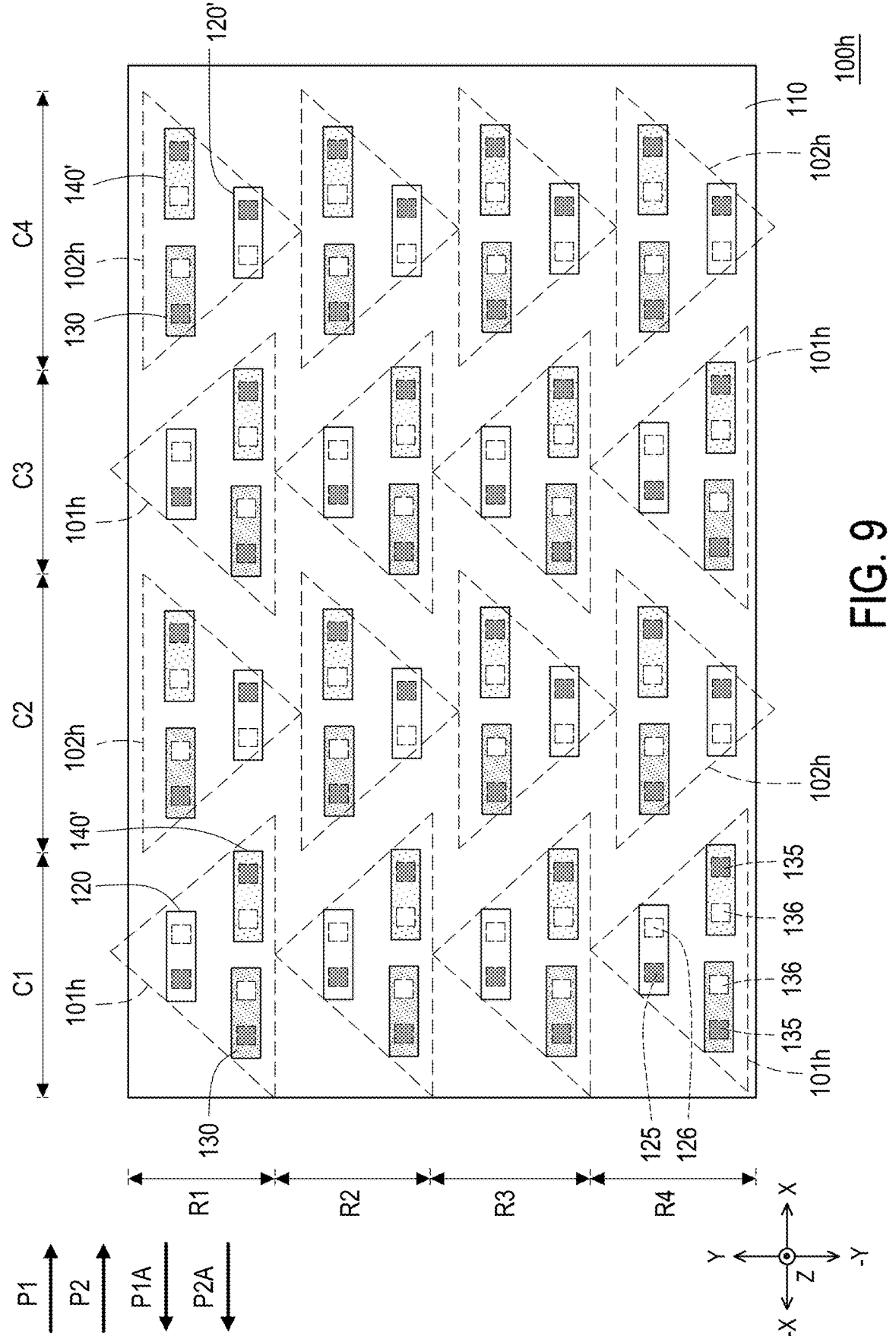
FIG. 9 is a schematic top view of an electronic device according to another embodiment of the disclosure.

FIG. 9 is a schematic top view of an electronic device according to another embodiment of the disclosure. The embodiment shown by FIG. 9 is similar to the embodiment shown by FIG. 8, and therefore, the same elements are denoted by the same reference numerals and details thereof are not repeated. The difference between the embodiment shown by FIG. 9 and the embodiment shown by FIG. 8 is that: in each pixel unit 101h and each pixel unit 102h of an electronic device 100h provided by this embodiment, the polarity direction of one semiconductor element of one color may be different from the polarity direction of the other color semiconductor elements of other colors.

To be specific, with reference to FIG. 9, in each pixel unit 101h, the semiconductor element 120 has the polarity direction P1, the semiconductor element 130 has the polarity direction P2, and the semiconductor element 140' has the polarity direction P2A. In each pixel unit 102h, the semiconductor element 120' has the polarity direction P1A, the semiconductor element 130 has the polarity direction P2, and the semiconductor element 140' has the polarity direction P2A. That is, the semiconductor element 130, the semiconductor element 140', and the semiconductor element 120 are arranged in the same pixel unit 101h, and the semiconductor element 130, the semiconductor element 140', and the semiconductor element 120 are arranged in a delta manner. The semiconductor element 130, the semiconductor element 120', and the semiconductor element 140' are arranged in the same pixel unit 102h, and the semiconductor element 130, the semiconductor element 120', and the semiconductor element 140' are arranged in a delta manner.

In this embodiment, the polarity direction P1A is different from the polarity direction P1, and the polarity direction P2A is different from the polarity direction P2. Therefore, the color displayed by the pixel units 102h of the second row C2 and the fourth row C4 at different viewing angles (for example, distorted white is displayed at the left viewing angle but true white is displayed at the right viewing angle) can be different from the color displayed by the pixel units 101h of the first row C1 and the third row C3 at different viewing angles (for example, true white is displayed at the left viewing angle but distorted white is displayed at the right viewing angle). As such, the color displayed by the pixel units 101h of the first row C1 and the third row C3 at different viewing angles may be balanced through the arrangement of the pixel units 102h of the second row C2 and the fourth row C4, so that the chromatic aberration of the pixel units 101h of the first row C1 and the third row C3 at different viewing angles is reduced, and that the chromatic aberration problem of the electronic device 100h at different viewing angles is improved.

Therefore, in the electronic device 100h provided by this embodiment, in the pixel units 101h and the pixel units 102h in two adjacent rows, by making the polarity directions of some semiconductor elements in one row of pixel units 101h different from those of some semiconductor elements in another row of pixel units 102h, the chromatic aberration problem of the electronic device 100h at different viewing angles may be improved.

Figure 10:
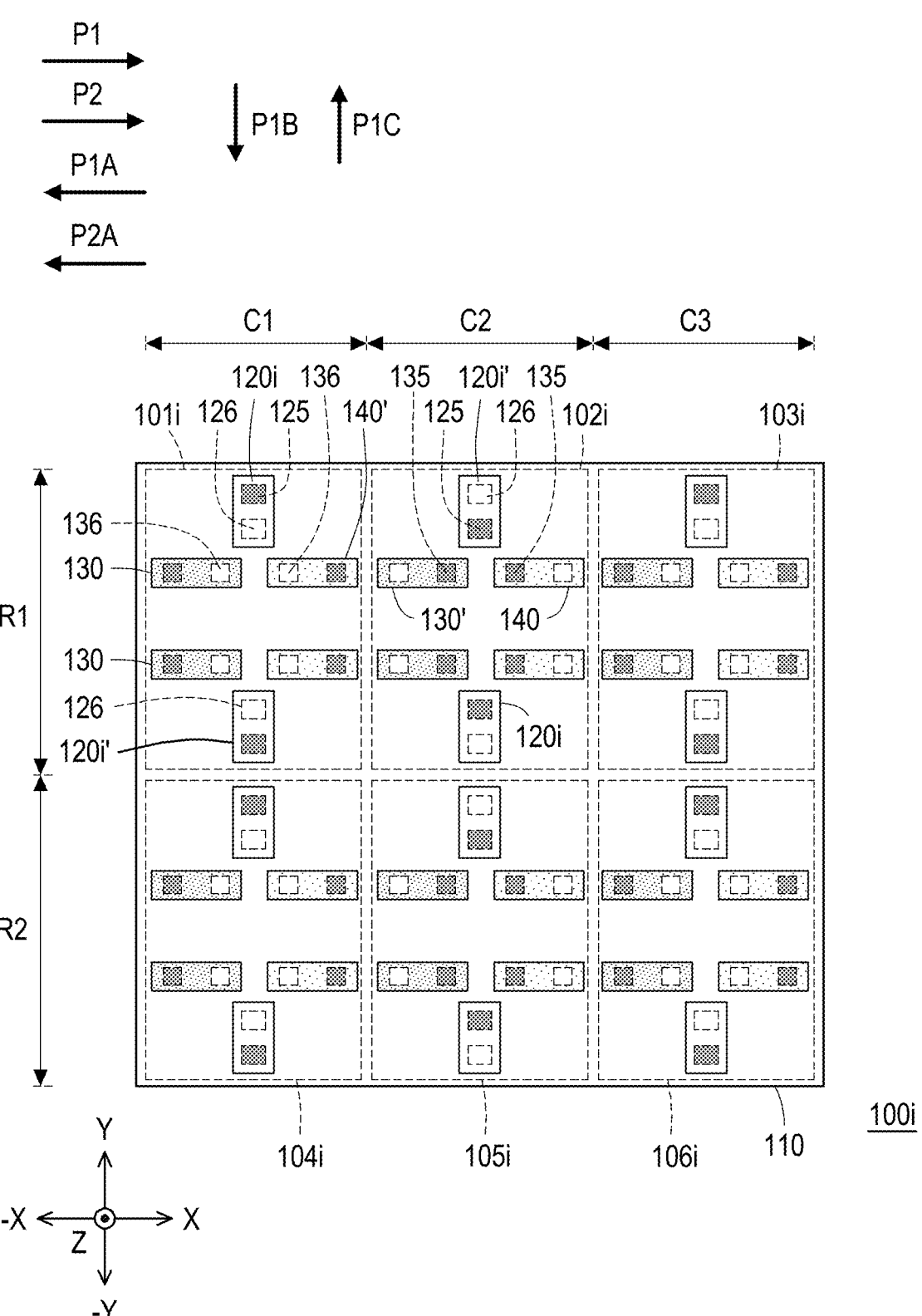
FIG. 10 is a schematic top view of an electronic device according to another embodiment of the disclosure.

FIG. 10 is a schematic top view of an electronic device according to another embodiment of the disclosure. The embodiment shown by FIG. 10 is similar to the embodiment shown by FIG. 1A, and therefore, the same elements are denoted by the same reference numerals and details thereof are not repeated. The difference between the embodiment shown by FIG. 10 and the embodiment shown by FIG. 1A is that: in an electronic device 100i provided by this embodiment, each of a pixel unit 101i, a pixel unit 102i, a pixel unit 103i, a pixel unit 104i, a pixel unit 105i, and a pixel unit 106i includes 6 semiconductor elements, and the 6 semiconductor elements are arranged in a radial manner.

To be specific, with reference to FIG. 10, each of the pixel unit 101i, the pixel unit 103i, the pixel unit 104i, and the pixel unit 106i includes a semiconductor element 120i, a semiconductor element 120i', 2 semiconductor elements 130, and 2 semiconductor elements 140', and each of the pixel unit 102i and the pixel unit 105i includes the semiconductor element 120i, the semiconductor element 120i', 2 semiconductor elements 130', and 2 semiconductor elements 140. Herein, the semiconductor element 120i has the polarity direction P1B, the semiconductor element 120i' has the polarity direction P1C, each of the semiconductor elements 130 and the semiconductor elements 140 has the polarity direction P2, and each of the semiconductor elements 130' and the semiconductor elements 140' has the polarity direction P2A. In this embodiment, the polarity direction P1B is substantially arranged in the direction −Y, and the polarity direction P1C is substantially arranged in the direction Y, so the polarity direction P1B and the polarity direction P1C are opposite to each other.

In this embodiment, in each of the pixel unit 101*i*, the pixel unit 103*i*, the pixel unit 104*i*, and the pixel unit 106*i*, the second-type electrode 126 of the semiconductor element 120*i*, the second-type electrode 126 of the semiconductor element 120*i'*, the second-type electrodes 136 of the 2 semiconductor elements 130, and the second-type electrodes 136 of the 2 semiconductor elements 140' are all gathered at the center of the radial arrangement, so that the electrodes of the same polarity may be gathered at the same place to achieve a common cathode arrangement or a common anode arrangement. In each of the pixel unit 102*i* and the pixel unit 105*i*, the first-type electrode 125 of the semiconductor element 120*i*, the first-type electrode 125 of the semiconductor element 120*i'*, the first-type electrodes 135 of the 2 semiconductor elements 130', and the first-type electrodes 135 of the 2 semiconductor elements 140 are all gathered at the center of the radial arrangement, so that the electrodes of the same polarity may be gathered at the same place to achieve the common cathode arrangement or the common anode arraignment. That is, one semiconductor element 130, one semiconductor element 140', the other semiconductor element 130, the other semiconductor element 140', the semiconductor element 120*i*, and the semiconductor element 120*i'* are arranged in the same pixel unit 101*i*, and the one semiconductor element 130, the one semiconductor element 140', the other semiconductor element 130, the other semiconductor element 140', the semiconductor element 120*i*, and the semiconductor element 120*i'* are arranged in a radial manner. One semiconductor element 130', one semiconductor element 140, the other semiconductor element 130', the other semiconductor element 140, the semiconductor element 120*i'*, and the semiconductor element 120*i* are arranged in the same pixel unit 102*i*, and the one semiconductor element 130', the one semiconductor element 140, the other semiconductor element 130', the other semiconductor element 140, the semiconductor element 120*i'*, and the semiconductor element 120*i* are arranged in a radial manner.

In this embodiment, each of the pixel unit 101*i*, the pixel unit 103*i*, the pixel unit 104*i*, and the pixel unit 106*i* itself includes the semiconductor element 120*i* and the semiconductor element 120*i'* of different polarity directions and the semiconductor element 130 and the semiconductor element 140' of different polarity directions, and each of the pixel unit 102*i* and the pixel unit 105*i* itself includes the semiconductor element 120*i* and the semiconductor element 120*i'* of different polarity directions and the semiconductor element 130' and the semiconductor element 140 of different polarity directions. In this way, the chromatic aberration of the pixel unit 101*i*, the pixel unit 102*i*, the pixel unit 103*i*, the pixel unit 104*i*, the pixel unit 105*i*, and the pixel unit 106*i* at different viewing angles is reduced, and that the chromatic aberration problem of the electronic device 100*i* at different viewing angles is improved.

FIG. 11 is a schematic top view of an electronic device according to another embodiment of the disclosure. The embodiment shown by FIG. 11 is similar to the embodiment shown by FIG. 10, and therefore, the same elements are denoted by the same reference numerals and details thereof are not repeated. The difference between the embodiment shown by FIG. 11 and the embodiment shown by FIG. 10 is that: in an electronic device 100*j* provided by this embodiment, each pixel unit (i.e., a pixel unit 101*j*, a pixel unit 102*j*, a pixel unit 103*j*, a pixel unit 104*j*, a pixel unit 105*j*, and a pixel unit 106*j*) has both the common cathode arrangement and the common anode arrangement.

To be specific, with reference to FIG. 11, in the electronic device 100*j* provided by this embodiment, each of the pixel unit 101*j*, the pixel unit 103*j*, the pixel unit 104*j*, and the pixel unit 106*j* includes 2 semiconductor elements 120*i*, the semiconductor element 130, the semiconductor element 130', the semiconductor element 140, and the semiconductor element 140', and each of the pixel unit 102*j* and the pixel unit 105*j* includes 2 semiconductor elements 120*i'*, the semiconductor element 130, the semiconductor elements 130', the semiconductor element 140, and the semiconductor element 140'.

In this embodiment, in each of the pixel unit 101*j*, the pixel unit 103*j*, the pixel unit 104*j*, and the pixel unit 106*j*, the second-type electrode 126 of one of the semiconductor elements 120*i*, the second-type electrode 136 of the semiconductor element 130, and the second-type electrode 136 of the semiconductor element 140' are gathered in the same place, and the first-type electrode 125 of the other semiconductor element 120*i*, the first-type electrode 135 of the semiconductor element 130', and the first-type electrode 135 of the semiconductor element 140 are gathered in another place. Therefore, each of the pixel unit 101*j*, the pixel unit 103*j*, the pixel unit 104*j*, and the pixel unit 106*j* has the common cathode arrangement and the common anode arrangement.

In addition, in each of the pixel unit 102*j* and the pixel unit 105*j*, the first-type electrode 125 of one of the semiconductor elements 120*i*, the first-type electrode 135 of the semiconductor element 130', and the first-type electrode 135 of the semiconductor element 140 are gathered in the same place, and the second-type electrode 126 of the other semiconductor element 120*i*, the second-type electrode 136 of the semiconductor element 130, and the second-type electrode 136 of the semiconductor element 140' are gathered in another place. Therefore, each of the pixel unit 102*j* and the pixel unit 105*j* has the common cathode arrangement and the common anode arrangement. That is, the semiconductor element 130, the semiconductor element 140', the semiconductor element 130', the semiconductor element 140, the semiconductor element 120*i*, and the other semiconductor element 120*i* are arranged in the same pixel unit 101*j*, and the semiconductor element 130, the semiconductor element 140' the semiconductor element 130', the semiconductor element 140, the semiconductor element 120*i'*, and the other semiconductor element 120*i* are arranged in a radial manner. The semiconductor element 130, the semiconductor element 140, the semiconductor element 130, the semiconductor element 140', the semiconductor element 120*i'*, and the other semiconductor element 120*i'* are arranged in the same pixel unit 102*j*, and the semiconductor element 130', the semiconductor element 140, the semiconductor element 130, the semiconductor element 140, the semiconductor element 120*i'* and the other semiconductor element 120*i'* are arranged in a radial manner.

Figure 12:
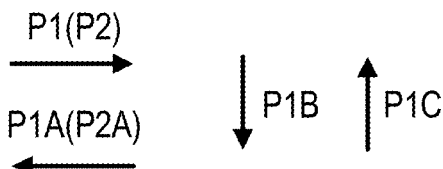
FIG. 12 is a schematic top view of an electronic device according to another embodiment of the disclosure.

FIG. 12 is a schematic top view of an electronic device according to another embodiment of the disclosure. The embodiment shown by FIG. 12 is similar to the embodiment shown by FIG. 1A, and therefore, the same elements are denoted by the same reference numerals and details thereof are not repeated. The difference between the embodiment shown by FIG. 12 and the embodiment shown by FIG. 1A is that: an electronic device 100*k* provided by this claim includes 12 pixel units (i.e., 6 pixel units 101*k* and 6 pixel units 102*k*) arranged in a 4×3 matrix (i.e., 4 columns and 3 rows), and the semiconductor elements in each pixel unit are arranged in a T-shape manner.

To be specific, with reference to FIG. 12, in the electronic device 100$k$ provided in this embodiment, a pixel unit 101$k$ and a pixel unit 102$k$ may be arranged adjacent to each other in the direction X, and the pixel unit 101$k$ and the pixel unit 102$k$ may also be arranged adjacent to each other in the direction Y.

The semiconductor element 120$i$, the semiconductor element 130, and the semiconductor element 140' in the pixel unit 101$k$ are arranged in a T-shape manner, and the semiconductor element 120$i$', the semiconductor element 130', and the semiconductor element 140 in the pixel unit 102$k$ are also arranged in a T-shape manner. In the pixel unit 101$k$, the second-type electrode 126 of the semiconductor element 120$i$, the second-type electrode 136 of the semiconductor element 130, and the second-type electrode 136 of the semiconductor element 140' may be gathered at the center of the T-shape arrangement, so that the electrodes of the same polarity may be gathered at the same place to achieve the common cathode arrangement or the common anode arrangement. In the pixel unit 102$k$, the first-type electrode 125 of the semiconductor element 120$i$', the first-type electrode 135 of the semiconductor element 130', and the first-type electrode 135 of the semiconductor element 140 may be gathered at the center of the T-shape arrangement, so that the electrodes of the same polarity may be gathered at the same place to achieve the common cathode arrangement or the common anode arrangement. That is, the semiconductor element 130, the semiconductor element 140', and the semiconductor element 120$i$ are arranged in the same pixel unit 101$k$, and the semiconductor element 130, the semiconductor element 140', and the semiconductor element 120$i$ are arranged in a T-shape manner. The semiconductor element 130, the semiconductor element 140, and the semiconductor element 120$i$' are arranged in the same pixel unit 102$k$, and the semiconductor element 130', the semiconductor element 140, and the semiconductor element 120$i$' are arranged in a T-shape manner. In this embodiment, the arrangement order from top to bottom in the first row C1 is the pixel unit 101$k$, the pixel unit 102$k$, the pixel unit 101$k$, and the pixel unit 102$k$. The arrangement order from top to bottom in the second row C2 is the pixel unit 102$k$, the pixel unit 101$k$, the pixel unit 102$k$, and the pixel unit 101$k$. The arrangement order from top to bottom in the third row C3 is the pixel unit 101$k$, the pixel unit 102$k$, the pixel unit 101$k$, and the pixel unit 102$k$. In some embodiments, the arrangement order from top to bottom in the first row C1 may also be the pixel unit 102$k$, the pixel unit 101$k$, the pixel unit 102$k$, and the pixel unit 101$k$. The arrangement order from top to bottom in the second row C2 may also be the pixel unit 101$k$, the pixel unit 102$k$, the pixel unit 101$k$, and the pixel unit 102$k$. The arrangement order from top to bottom in the third row C3 may also be the pixel unit 102$k$, the pixel unit 101$k$, the pixel unit 102$k$, and the pixel unit 101$k$.

In this embodiment, the pixel unit 101$k$ itself includes semiconductor element 130 and the semiconductor element 140' with different polarity directions, and the pixel unit 102$k$ itself includes the semiconductor element 130' and the semiconductor element 140 with different polarity directions. In this way, the chromatic aberration of the pixel unit 101$k$ and the pixel unit 102$k$ at different viewing angles may be reduced, and that the chromatic aberration problem of the electronic device 100$k$ at different viewing angles is improved.

Figure 13:
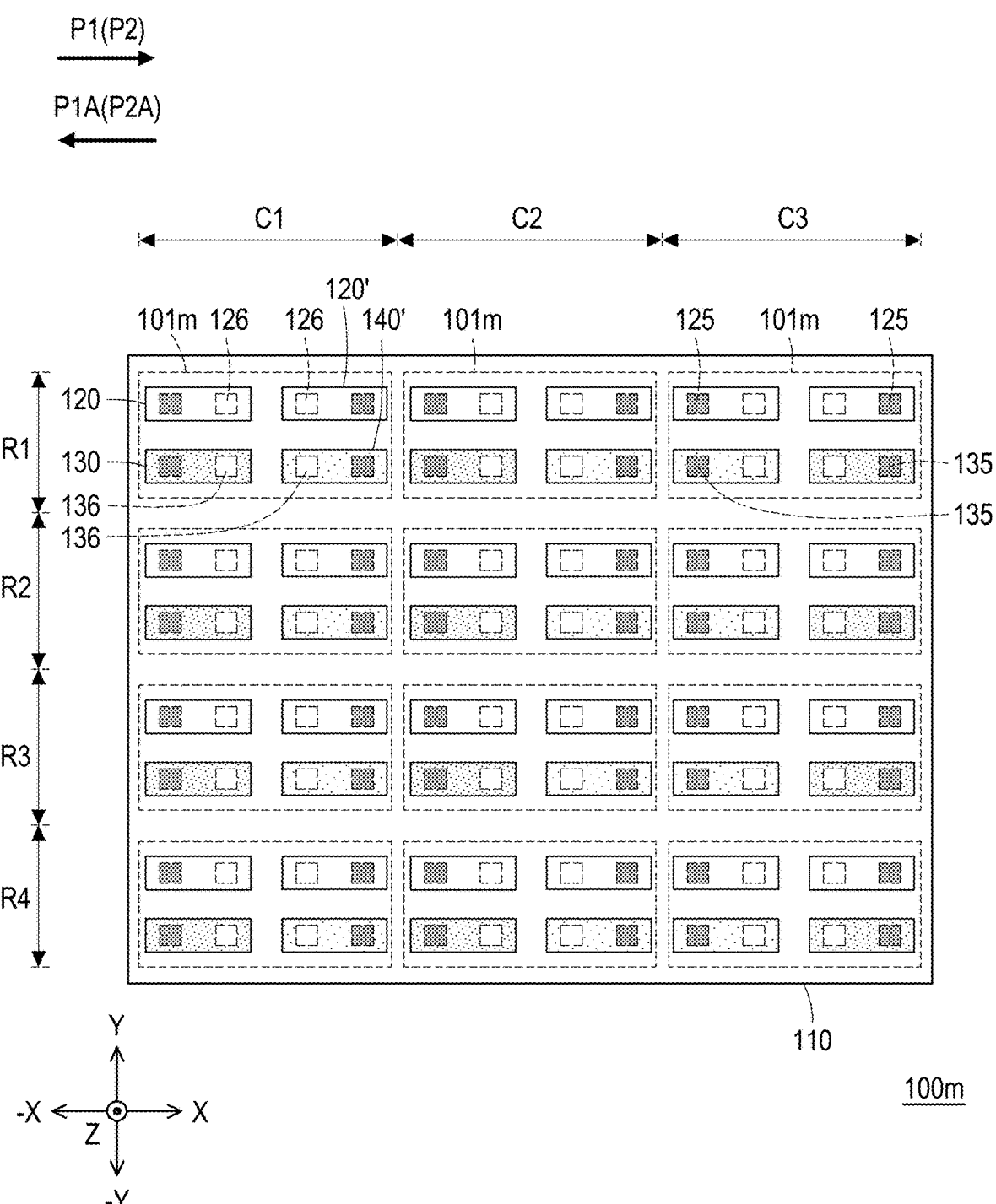
FIG. 13 is a schematic top view of an electronic device according to another embodiment of the disclosure.

FIG. 13 is a schematic top view of an electronic device according to another embodiment of the disclosure. The embodiment shown by FIG. 13 is similar to the embodiment shown by FIG. 1A, and therefore, the same elements are denoted by the same reference numerals and details thereof are not repeated. The difference between the embodiment shown by FIG. 13 and the embodiment shown by FIG. 1A is that: an electronic device 100$m$ provided by this claim includes 12 pixel units 101$m$ arranged in a 4×3 matrix (i.e., 4 columns and 3 rows), each pixel unit 101$m$ includes 4 semiconductor elements, and the 4 semiconductor elements are arranged in a rectangular manner.

To be specific, with reference to FIG. 13, in the electronic device 100$m$ provided in this claim, each of the pixel units 101$m$ includes the semiconductor element 120, the semiconductor element 120', the semiconductor element 130, and the semiconductor element 140'. The semiconductor element 120 is adjacent to the semiconductor element 120' in the direction X, and the semiconductor element 120 is adjacent to the semiconductor element 130 in the direction Y. The second-type electrode 126 of the semiconductor element 120, the second-type electrode 126 of the semiconductor element 120', and the second-type electrode 136 of the semiconductor element 130, and the second-type electrode 136 of the semiconductor element 140' may be gathered at the center of the rectangular arrangement, so that the electrodes of the same polarity may be gathered at the same place to achieve the common cathode arrangement or the common anode arrangement. That is, the semiconductor element 120, the semiconductor element 120', the semiconductor element 130, and the semiconductor element 140' are arranged in the same pixel unit 101$m$, and the semiconductor element 120, the semiconductor element 120', the semiconductor element 130, and the semiconductor element 140' are arranged in a rectangular manner.

In addition, each pixel unit 101$m$ itself includes the semiconductor element 120 and the semiconductor element 120' of different polarity directions and the semiconductor element 130 and the semiconductor element 140' of different polarity directions. In this way, the chromatic aberration of the pixel units 101$m$ at different viewing angles may be reduced, and that the chromatic aberration problem of the electronic device 100$m$ at different viewing angles is improved.

Figure 14:
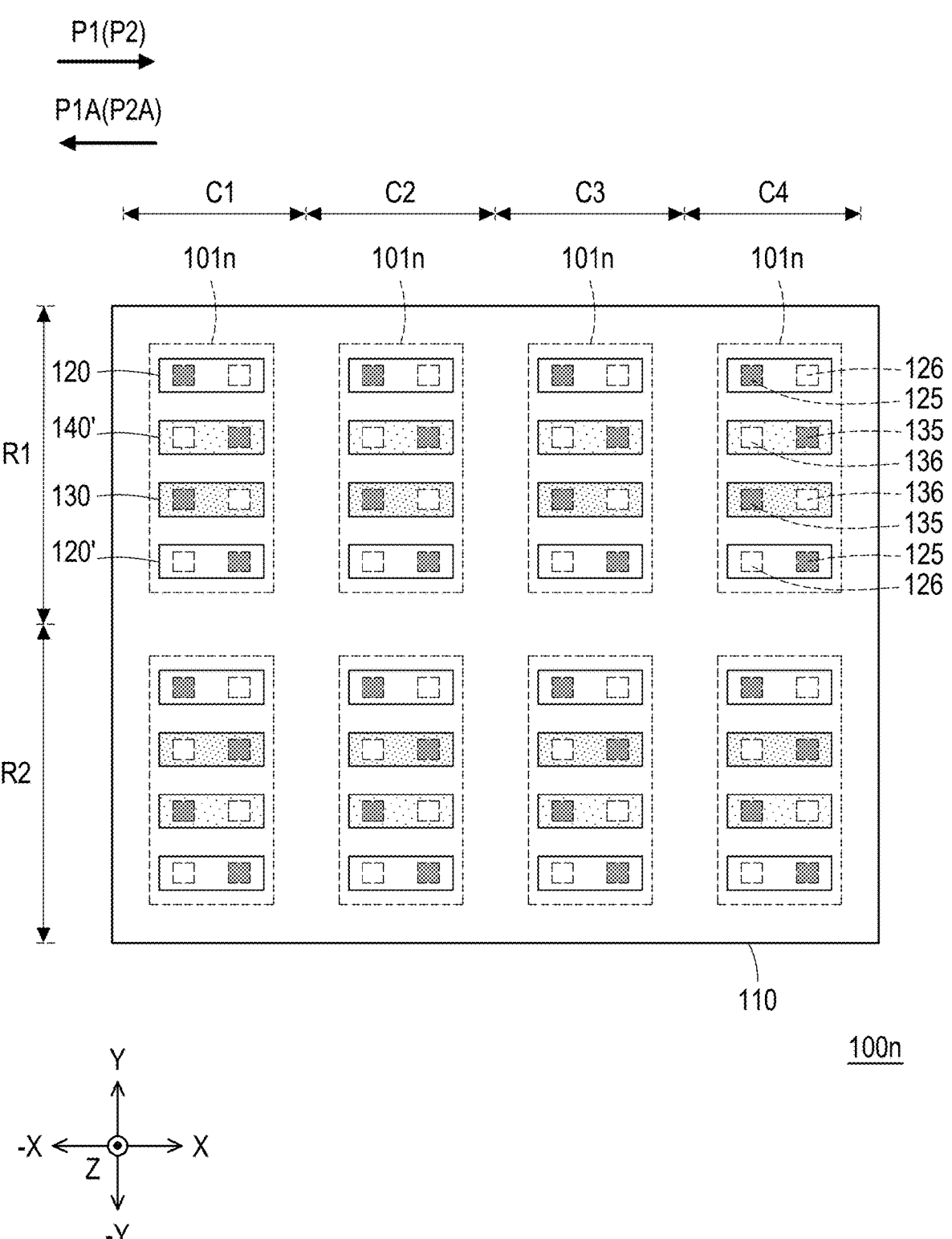
FIG. 14 is a schematic top view of an electronic device according to another embodiment of the disclosure.

FIG. 14 is a schematic top view of an electronic device according to another embodiment of the disclosure. The embodiment shown by FIG. 14 is similar to the embodiment shown by FIG. 1A, and therefore, the same elements are denoted by the same reference numerals and details thereof are not repeated. The difference between the embodiment shown by FIG. 14 and the embodiment shown by FIG. 1A is that: an electronic device 100$n$ provided by this claim includes 8 pixel units 101$n$ arranged in a 2×4 matrix (i.e., 2 columns and 4 rows), each pixel unit 101$n$ includes 4 semiconductor elements, and the 4 semiconductor elements are arranged in a linear manner.

To be specific, with reference to FIG. 14, in the electronic device 100$n$ provided in this claim, each of the pixel units 101$n$ includes the semiconductor element 120, the semiconductor element 120', the semiconductor element 130, and the semiconductor element 140'. Herein, the semiconductor elements in each of the pixel units 101$n$ are arranged in a linear manner according to the order of the semiconductor element 120, the semiconductor element 140, the semiconductor element 130, and the semiconductor element 120'. That is, the semiconductor element 120, the semiconductor element 140', the semiconductor element 130, and the semiconductor element 120' are arranged in the same pixel unit 101$n$, and the semiconductor element 120, the semiconductor element 140', the semiconductor element 130, and the semiconductor element 120' are arranged in a linear manner.

In this embodiment, each pixel unit 101*n* itself includes the semiconductor element 120 and the semiconductor element 120' of different polarity directions and the semiconductor element 130 and the semiconductor element 140' of different polarity directions. In this way, the chromatic aberration of the pixel units 101*n* at different viewing angles may be reduced, and that the chromatic aberration problem of the electronic device 100*n* at different viewing angles is improved.

In view of the foregoing, in the electronic device provided by the embodiments of the disclosure, the first polarity direction of the first semiconductor element (e.g., the semiconductor element 120) is different from the second polarity direction of the second semiconductor element (e.g., the semiconductor element 120'). In this way, the color displayed by the pixel unit including the second semiconductor element at different viewing angles may be balanced through the arrangement of the pixel unit including the first semiconductor element, and the chromatic aberration problem of the electronic device at different viewing angles may thereby be improved. The first polarity direction of the third semiconductor element (e.g., the semiconductor element 130) is different from the second polarity direction of the fourth semiconductor element (e.g., the semiconductor element 130'). In this way, the color displayed by the pixel unit including the fourth semiconductor element at different viewing angles may be balanced through the arrangement of the pixel unit including the third semiconductor element, and the chromatic aberration problem of the electronic device at different viewing angles may thereby be improved. In two adjacent pixel units, since the arrangement order of the semiconductor elements in one pixel unit is different from the arrangement order of the semiconductor elements in the other pixel unit, the chromatic aberration problem of the electronic device at a vertical viewing angle is improved.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the disclosure.

What is claimed is:

1. An electronic device, comprising:
   a substrate;
   a first semiconductor element, disposed on the substrate, wherein the first semiconductor element comprises a first polarity direction;
   a second semiconductor element, disposed on the substrate and adjacent to the first semiconductor element, wherein the second semiconductor element comprises a second polarity direction,
   a third semiconductor element, disposed on the substrate and comprising a third polarity direction;
   a fourth semiconductor element, disposed on the substrate and comprising a fourth polarity direction;
   a fifth semiconductor element, disposed on the substrate and comprising a fifth polarity direction; and
   a sixth semiconductor element, disposed on the substrate and comprising a sixth polarity direction,
   wherein the first polarity direction and the second polarity direction are different, the third polarity direction and the fourth polarity direction are different, and the fifth polarity direction and the sixth polarity direction are different,
   wherein the first semiconductor element, the third semiconductor element, and the fifth semiconductor element are disposed in a same pixel unit, and the first semiconductor element, the third semiconductor element, and the fifth semiconductor element are arranged in a linear manner in a first direction,
   wherein the first semiconductor element and the second semiconductor element are disposed in different pixel units, the first semiconductor element and the second semiconductor element are light emitting diodes emitting different colors, and the first semiconductor element and the second semiconductor element are adjacent to each other in the first direction.

2. The electronic device according to claim 1, wherein the third semiconductor element and the fourth semiconductor element are disposed in different pixel units, and the third semiconductor element and the fourth semiconductor element are light emitting diodes emitting a same color.

3. The electronic device according to claim 1, wherein the first semiconductor element and the third semiconductor element are adjacent to each other in the first direction.

4. The electronic device according to claim 1, wherein the first polarity direction and the third polarity direction are the same.

5. The electronic device according to claim 1, wherein the first polarity direction, the third polarity direction, and the fifth polarity direction are the same.

* * * * *